United States Patent
Watanabe et al.

(10) Patent No.: US 11,979,139 B2
(45) Date of Patent: May 7, 2024

(54) ELASTIC WAVE DEVICE, ELASTIC WAVES FILTER, DUPLEXER, AND MODULE

(71) Applicants: SANAN JAPAN TECHNOLOGY CORPORATION, Tokyo (JP); UNIVERSITY OF YAMANASHI, Yamanashi (JP)

(72) Inventors: Noriyuki Watanabe, Tokyo (JP); Hiroshi Nakamura, Tokyo (JP); Shoji Kakio, Yamanashi (JP)

(73) Assignees: Sanan Japan Technology Corporation; UNIVERSITY OF YAMANASHI

( * ) Notice: Subject to any disclaimer, the term of this patent is extended or adjusted under 35 U.S.C. 154(b) by 288 days.

(21) Appl. No.: 17/415,475

(22) PCT Filed: Dec. 19, 2019

(86) PCT No.: PCT/JP2019/049833
§ 371 (c)(1),
(2) Date: Jun. 17, 2021

(87) PCT Pub. No.: WO2020/130076
PCT Pub. Date: Jun. 25, 2020

(65) Prior Publication Data
US 2022/0069799 A1 Mar. 3, 2022

(30) Foreign Application Priority Data
Dec. 20, 2018 (JP) .................. 2018-238956

(51) Int. Cl.
*H03H 9/17* (2006.01)
*H03H 9/13* (2006.01)
(Continued)

(52) U.S. Cl.
CPC ............... *H03H 9/17* (2013.01); *H03H 9/13* (2013.01); *H03H 9/54* (2013.01); *H03H 9/70* (2013.01)

(58) Field of Classification Search
None
See application file for complete search history.

(56) References Cited

U.S. PATENT DOCUMENTS

2004/0056560 A1* 3/2004 Wang ................. H03H 9/02133
310/311
2005/0271823 A1* 12/2005 Kijima ................ C23C 18/1216
501/12
(Continued)

FOREIGN PATENT DOCUMENTS

JP 2012253497 A 12/2012
JP 2018093487 A 6/2018
(Continued)

OTHER PUBLICATIONS

International Search Report and Written Opinion received in PCT Application No. PCT/JP2019/049833 dated Mar. 10, 2020 (Engl. translation of ISR only).
(Continued)

*Primary Examiner* — Kenneth B Wells
(74) *Attorney, Agent, or Firm* — Dorsey & Whitney LLP

(57) ABSTRACT

An elastic wave device that excites main vibration of an SH mode includes a piezoelectric layer formed from a piezoelectric material, a carrier substrate, and an IDT electrode formed on the piezoelectric layer. When a wavelength of an elastic wave, which is determined by an electrode cycle P of the IDT electrode, is represented by λ, the piezoelectric layer has a thickness of 0.15λ or more and 1.5λ or less. The carrier substrate has an acoustic anisotropy, and is arranged in a
(Continued)

crystal orientation that reduces unnecessary vibrations of an SV mode and a vertical L-mode.

18 Claims, 25 Drawing Sheets

(51) Int. Cl.
*H03H 9/54* (2006.01)
*H03H 9/70* (2006.01)

(56) References Cited

U.S. PATENT DOCUMENTS

| | | | | |
|---|---|---|---|---|
| 2005/0275696 A1* | 12/2005 | Miyazawa | ........... | B41J 2/14233 |
| | | | | 310/358 |
| 2006/0179642 A1* | 8/2006 | Kawamura | .............. | H03H 3/02 |
| | | | | 29/609.1 |

FOREIGN PATENT DOCUMENTS

| | | |
|---|---|---|
| JP | 2018518840 A | 7/2018 |
| WO | 2013047433 A1 | 4/2013 |
| WO | 2013172251 A1 | 11/2013 |
| WO | 2017209131 A1 | 12/2017 |
| WO | 2018151147 A1 | 8/2018 |
| WO | 2018164211 A1 | 9/2018 |

OTHER PUBLICATIONS

CN Office Action dated Oct. 24, 2023 for CN Appl. No. 201980083942.1 with EN translation.

JP Final Office Action dated Nov. 24, 2022 for JP Appl. No. 2020-561508 with EN translation.

JP Office Action dated Mar. 15, 2022 for JP Appl. No. 2020-561508 with EN translation.

* cited by examiner (0, 45, $\psi$)

ELASTIC WAVE DEVICE, ELASTIC WAVES FILTER, DUPLEXER, AND MODULE

CROSS-REFERENCE TO RELATED APPLICATION(S)

This application is a U.S. National Stage filing under 35 U.S.C. § 371 of PCT Application No. PCT/JP2019/049833, filed Dec. 19, 2019, which claims priority to Japanese Application No. 2018-238956 filed Dec. 20, 2018, which applications are incorporated herein by reference, in their entirety, for any purpose.

FIELD

The present invention relates to an elastic wave device, an elastic wave filter, a duplexer and a module which use a surface elastic wave.

BACKGROUND

In a communication equipment terminal such as a mobile phone terminal or a portable information terminal, a higher quality factor is required for an elastic wave device which is used for a filter or a duplexer of an antenna. Elastic wave devices include a bulk elastic wave device and a surface elastic wave device. Of these elastic wave devices, the surface elastic wave device is mainly used, but the surface elastic wave device has a problem that the Q value is lower than that of the bulk elastic wave device.

Then, in order to improve the Q value, as described in Patent Literature 1, there is a surface elastic wave device that has a thin piezoelectric layer formed from lithium tantalate, lithium niobate or the like and stuck on a substrate formed from silicon, sapphire or the like to form a multilayer film structure, so that leakage of an elastic wave in the depth direction of the elastic wave substrate is greatly reduced, thereby greatly improving the Q value.

PRIOR ART

Patent Literature

Patent literature 1: JP 2002-534886 A

SUMMARY

Technical Problem

However, in the structure which has improved the confinement of the elastic wave in the piezoelectric layer as in the above-described conventional elastic wave device, another propagation mode such as a longitudinal wave other than the surface elastic wave which should be propagated is also excited, and large parasitic resonance (spurious emission) occurs in a frequency band higher than a pass band, in some cases. This spurious emission in the high frequency band adversely affects attenuation characteristics of the filter. As a result, there is a possibility that this leads to an adverse effect on a system of the pass band which is used in the mobile communication equipment, or that a signal transmitted from the system gives an adverse effect on a system in another frequency band. However, it is difficult to reduce the spurious emission only by adjustment of a layer thickness of the piezoelectric layer constituting the elastic wave device.

In view of the above problems, it is an object of the present invention to provide an elastic wave device, an elastic wave filter, a duplexer and a module which can reduce the spurious emission in the high frequency band, while keeping the Q value high.

Means for Solving the Problems

According to one example of present invention, an elastic wave device that excites main vibration of an SH mode includes a piezoelectric layer formed from a piezoelectric material, a carrier substrate, and an IDT electrode formed on the piezoelectric layer, wherein when a wavelength of an elastic wave, which is determined by an electrode cycle of the IDT electrode, is represented by $\lambda$, the piezoelectric layer has a thickness of $0.15\lambda$ or more and $1.5\lambda$ or less, and the carrier substrate has an acoustic anisotropy, and is arranged in a crystal orientation that reduces unnecessary vibrations of an SV mode and a vertical L-mode.

According to one example of present invention, an elastic wave filter, a duplexer and a module include above mentioned elastic wave device.

Advantageous Effects of Invention

According to the above structure, an elastic wave device, an elastic wave filter, a duplexer and a module can be provided in which unnecessary vibrations are effectively reduced, and the spurious emission in the high frequency band is effectively reduced.

DESCRIPTION OF EMBODIMENTS

Figure 1:
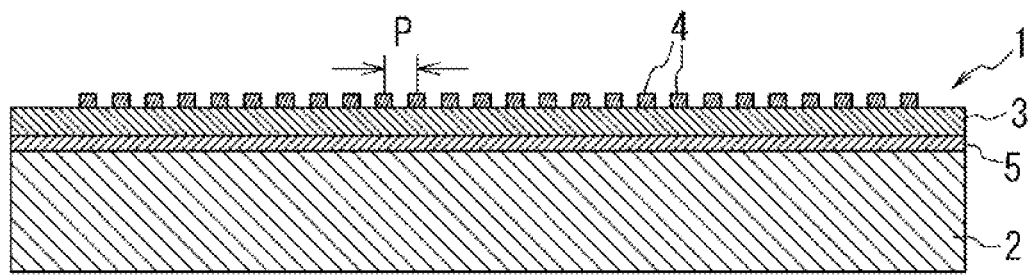
FIG. 1 is a cross-sectional view showing an embodiment of an elastic wave device according to the present invention.

FIG. 1 is a cross-sectional view showing a first embodiment of an elastic wave device according to the present invention. This elastic wave device 1 includes a carrier substrate 2, a piezoelectric layer 3, an IDT electrode 4 that is formed on the piezoelectric layer 3, and an intermediate layer 5 that is provided between the carrier substrate 2 and the piezoelectric layer 3.

Figure 2A:
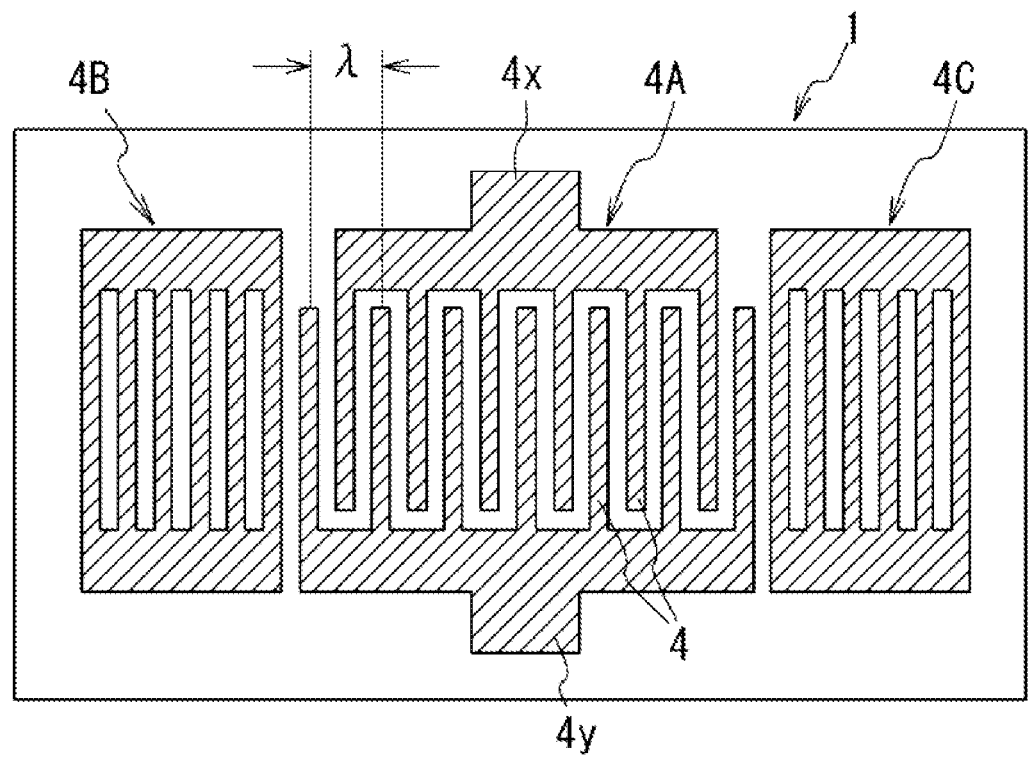
FIG. 2A is a plan view of the elastic wave device according to FIG. 1.
Figure 2B:
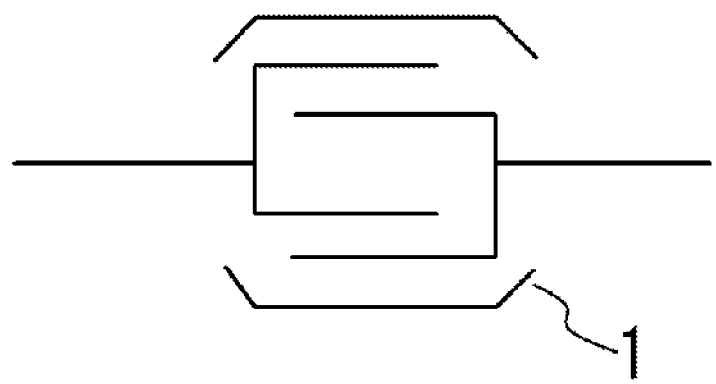
FIG. 2B shows a symbol that schematically shows the elastic wave device of FIG. 2A.

As is shown in FIG. 2A, the IDT electrode 4 includes an IDT 4A that serves as an excitation portion, and reflectors 4B and 4C. When a high frequency signal is input between an input end $4x$ and an output end $4y$ of the IDT 4A, an electric field is generated between electrodes, a surface elastic wave is excited and propagates on the piezoelectric layer 3, and is reflected by the reflectors 4B and 4C to produce electric resonance. The resonance frequency $f_R$ is expressed by $f_R=v/\lambda$, when the wavelength of the surface elastic wave propagating in the piezoelectric layer 3 is represented by $\lambda$ and the acoustic velocity peculiar to the piezoelectric layer material is represented by v; and is determined by $P=\lambda/2$ when the electrode cycle is represented by P. FIG. 2B is a symbol that schematically shows the elastic wave device of FIG. 2A.

For the carrier substrate 2, for example, silicon having a non-amorphous crystal form, or crystalline sapphire is used. A material to be used for the carrier substrate 2 is not limited thereto, and may be another material such as polycrystalline silicon, polycrystalline $Al_2O_3$ and polycrystalline sapphire, as long as the material can solve the problems of the present invention.

For the piezoelectric layer 3, lithium tantalate ($LiTaO_3$) (hereinafter referred to as LT in some cases) or lithium niobate ($LiNbO_3$) (hereinafter referred to as LN in some cases) is used. However, the piezoelectric layer 3 is not limited to these materials, and another material having piezoelectricity can also be used.

For the IDT electrode 4, for example, Al, Au, Cu, Ni, Pt, Ti, Cr, Ag, an alloy thereof or the like can be used, but another metal or alloy may also be used.

The intermediate layer 5 is provided for at least one of the purposes of increasing a bonding strength between the carrier substrate 2 and the piezoelectric layer 3, and speeding up a propagation speed of the elastic wave. When the intermediate layer 5 is provided for the purpose of increasing the bonding strength between the carrier substrate 2 and the piezoelectric layer 3, silicon dioxide ($SiO_2$) or the like, for example, is used for the intermediate layer 5. In addition, when the intermediate layer 5 is provided as a speeding-up layer of the elastic wave, aluminum nitride (AlN), aluminum boron nitride ($B_XAl_{1-X}N$) or the like, for example, is used.

Figure 3A:
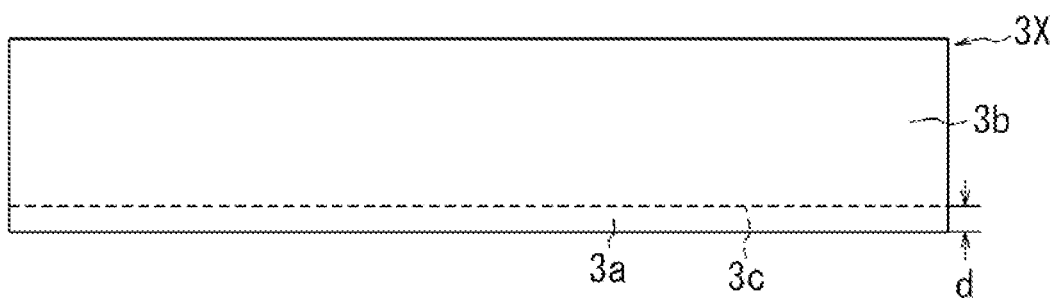
FIG. 3A is a diagram showing a first step of manufacturing process of the elastic wave device according to FIG. 1.

When such an elastic wave device 1 is manufactured, it is effective to use the piezoelectric layer 3 as thin as possible, in order to improve the Q value. The manufacturing process for that purpose will be described with reference to FIGS. 3A to 3E. As the piezoelectric layer 3, LT of 15° to 52° Y-cut X-propagation is used for example. As is shown in FIG. 3A, ions of hydrogen or helium, for example, are implanted into the carrier substrate 2 side of the piezoelectric layer material 3X formed of the LT which has been cut in the above way. Due to the ions being implanted, a thin layer 3a containing the ions is formed on one face of the piezoelectric layer material 3X, and a remaining layer 3b becomes a layer containing no ions.

Figure 3B:
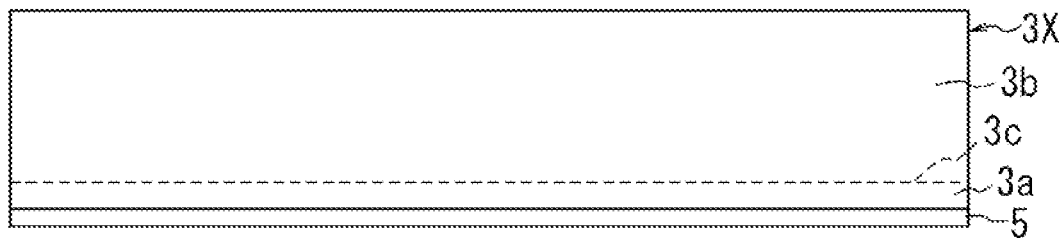
FIG. 3B is a diagram showing a second step of manufacturing process of the elastic wave device according to FIG. 1.

Next, as is shown in FIG. 3B, a film to be the intermediate layer 5 is formed on the layer 3a of the piezoelectric layer material 3X, by a film forming technique such as CVD, vapor deposition or sputtering. Note that the intermediate layer 5 may be formed on the carrier substrate 2. When silicon is used for the carrier substrate, it is also possible to form $SiO_2$ of the intermediate layer, by subjecting the carrier substrate to oxidation treatment by heating.

Figure 3C:
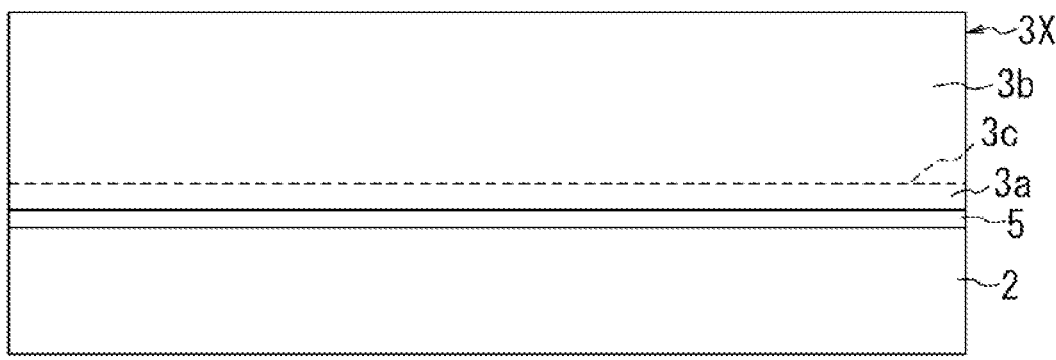
FIG. 3C is a diagram showing a third step of manufacturing process of the elastic wave device according to FIG. 1.

Next, as is shown in FIG. 3C, the carrier substrate 2 is bonded to the intermediate layer 5. At the time of this bonding, bonding faces of the intermediate layer 5 and the carrier substrate 2 are subjected to cleaning for removing dust so that the faces can be bonded to each other, and then are subjected to such activation treatment as to enable the bonding; and the faces are brought into close contact with each other in an activated state and can be bonded. The intermediate layer 5 and the carrier substrate 2 may be bonded via a thin adhesive layer for bonding.

Figure 3D:
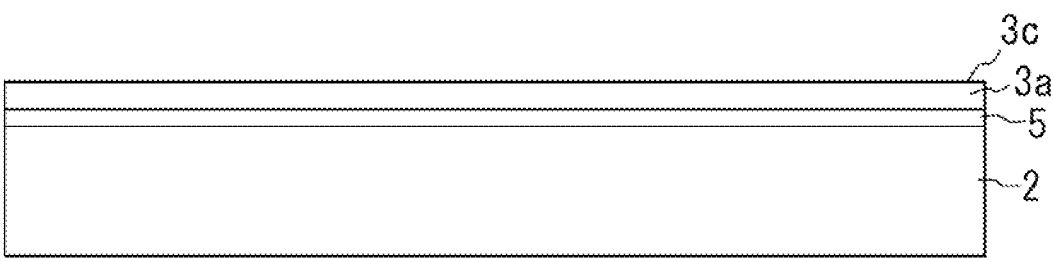
FIG. 3D is a diagram showing a fourth step of manufacturing process of the elastic wave device according to FIG. 1.

In this way, after the carrier substrate 2 is bonded to the piezoelectric layer material 3X via the intermediate layer 5, the bonded product is heated at high speed, and thereby a crack is formed in a boundary 3c between the layer 3b which does not contain the ions and the layer 3a which contains the ions. Because of this, the layer 3b which does not contain the ions can be separated firm the layer 3a which contains the ions, in other words, a portion which becomes the piezoelectric layer, at the boundary 3c; and as is shown in FIG. 3D, such a state can be realized that a thin piezoelectric layer 3a is provided on the substrate.

Figure 3E:
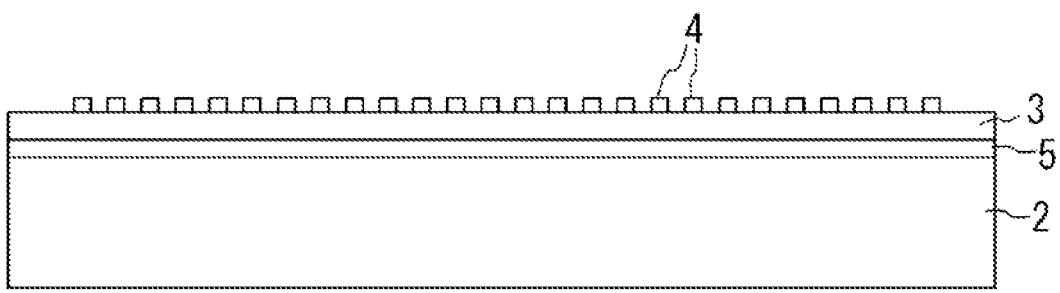
FIG. 3E is a diagram showing a fifth step of manufacturing process of the elastic wave device according to FIG. 1.

Next, the surface 3c of the piezoelectric layer 3a is polished to be smooth to form the piezoelectric layer 3, and then, as is shown in FIG. 3E, the IDT electrode 4 is formed on the smoothed face with the use of a photolithography technique.

In the elastic wave device configured as described above, in the present invention, the crystal orientation of the carrier substrate 2 with respect to a propagation direction of the elastic wave in the piezoelectric layer 3 is configured so as to be different from that in a conventional example. As one example, the case will be described where LT of 42° Y-cut X-propagation is used for the piezoelectric layer 3, silicon dioxide ($SiO_2$) is used for the intermediate layer 5, and silicon is used for the carrier substrate 2.

In the conventional example, the crystal orientation of the carrier substrate 2 with respect to the propagation direction of the elastic wave in the piezoelectric layer 3 is a general-purpose (100) crystal orientation, and the propagation direction ψ=0 degrees, in other words, Euler angles (ϕ, θ, ψ) of a (z, x, z) form of the carrier substrate 2 are (90 degrees, 90 degrees, 0 degrees). On the other hand, in the case of the example of the present invention, the crystal orientation of the carrier substrate 2 with respect to the propagation direction of the elastic wave in the piezoelectric layer 3 is set to a range as described later, in notation of the Euler angles (ϕ, θ, ψ) of the (z, x, z) form of the carrier substrate 2.

Figure 4:
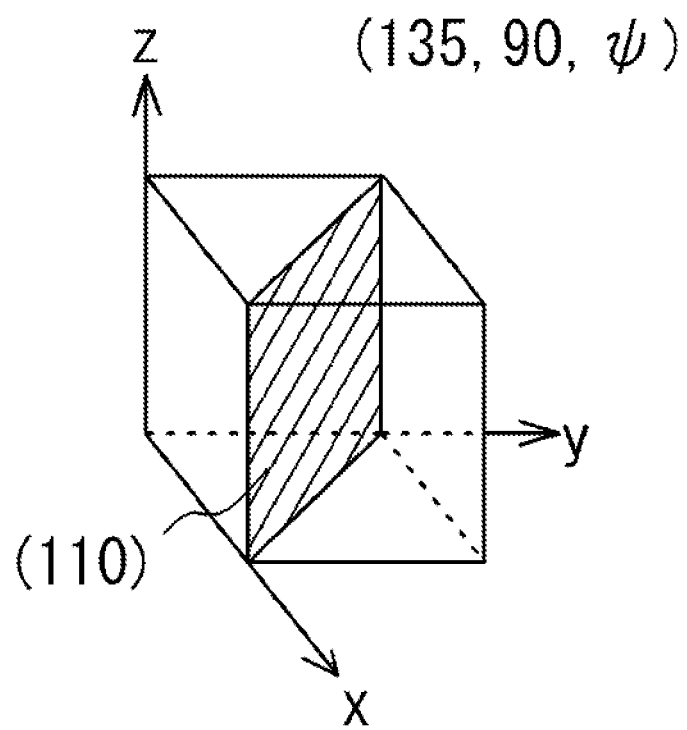
FIG. 4 is a diagram showing one example of the crystal orientation of silicon used as carrier substrate of the elastic wave device.
Figure 5A:
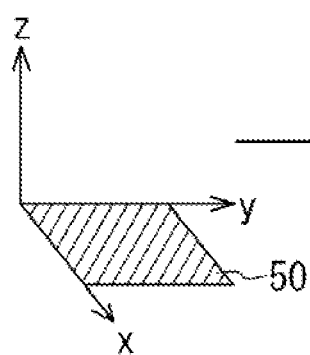
FIG. 5A shows a first step of obtaining (110) plane in (z, x, z) form, and the Euler angles (135°, 90°, ψ).
Figure 5B:
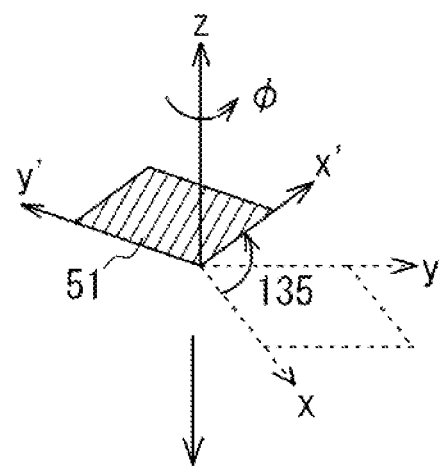
FIG. 5B shows a second step of obtaining (110) plane in (z, x, z) form, and the Euler angles (135°, 90°, ψ).
Figure 5D:
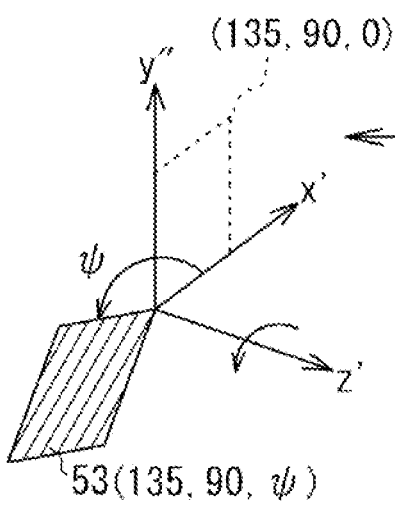
FIG. 5D shows a fourth step of obtaining (110) plane in (z, x, z) form, and the Euler angles (135°, 90°, ψ).
Figure 5C:
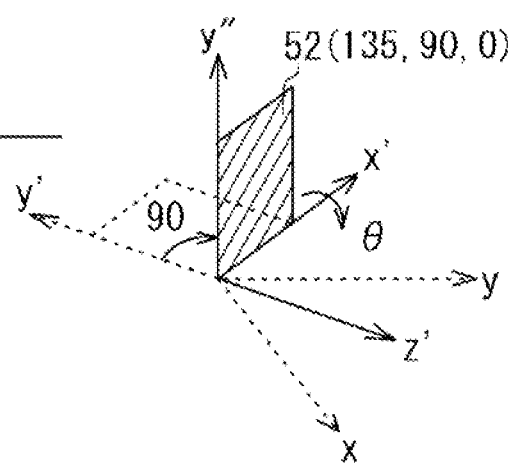
FIG. 5C shows a third step of obtaining (110) plane in (z, x, z) form, and the Euler angles (135°, 90°, ψ).

Here, the Euler angles (ϕ, θ, ψ) of the (z, x, z) form will be described with reference to the drawings. FIG. 4 shows a (110) plane as one example of the crystal orientation of silicon. Because silicon is a cubic system. FIG. 4 shows the case where crystal axes x, y and z are perpendicular to each other, and the Euler angles (ϕ, θ, ψ)=(135°, 90°, 0°).

FIG. 5 shows a process for obtaining this (110) plane in (z, x, z) form, and the Euler angles (135°, 90°, ψ). Firstly, as is shown in FIG. 5A, an xy plane 50 is assumed Next, as is shown in FIG. 5B, the plane 50 is rotated by +=135° around the z-axis. Thereby, the x'-axis and the y'-axis are obtained that are the x-axis and the y-axis which have been rotated by 135°, respectively, and also a plane 51 which is surrounded by the x'-axis and the y-axis is obtained as a plane corresponding to the plane 50. Next, as is shown in FIG. 5C, the plane 51 is rotated by θ=90° around the x'-axis. Thereby, the y"-axis and the z'-axis are obtained that are the y'-axis and z-axis which have been rotated by 90°, respectively, and a plane 52 is obtained which is surrounded by the x'-axis and the y"-axis. This plane 52 is a plane of (ϕ, θ, ψ)=(135°, 90°, 0°). Here, when the Euler angles are determined to be (ϕ, θ, ψ)=(135°, 90°, ψ) and an angle ψ is changed, a plane 53 is obtained which has been rotated by the angle ψ around the z'-axis, as is shown in FIG. 5D.

Figure 6:
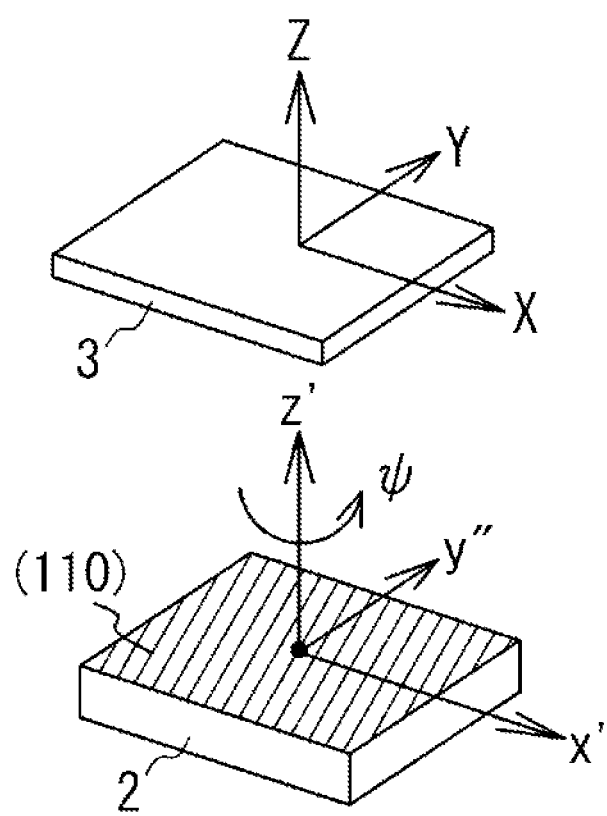
FIG. 6 shows a view for explaining a bonding positional relationship between the piezoelectric layer and the carrier substrate having a crystal orientation of FIG. 4 and FIG. 5.

FIG. 6 shows a view for explaining a change in a positional relationship between the piezoelectric layer 3 and the carrier substrate 2, along with a change in the angle ψ in the Eider angles (ϕ, θ, ψ=(135°, 90°, ψ) in the carrier substrate 2 of which the (110) plane shown in FIG. 5 is determined as the bonding face. In FIG. 6, the x'-axis of the carrier substrate 2 is the x'-axis at the time when the angle ψ=0°. The x'-axis at this time substantially coincides with the X-axis of the piezoelectric layer 3, in other words, the propagation direction of the surface acoustic wave. When the carrier substrate 2 is rotated by an angle ψ around the z'-axis, the x'-axis and the y"-axis are also rotated by the angle ψ, and the bonding face is displaced. By the crystal orientation being displaced in this way by the rotation of the bonding face of the carrier substrate 2, the degree of reduction of the spurious emission in the high frequency band can be changed.

In the investigation of the relationship between the crystal orientation and the reduction of the spurious emission in the high frequency band, in comparison between the conventional example and the example of the present invention, the configurations of the examples were set to be common except for the crystal orientations of the carrier substrates 2. Specifically, when the wavelength of the elastic wave, which is determined by the electrode cycle P, was represented by λ, the wavelength was set at λ=1.8 μm, the number of electrodes in total of the 4x side of the input end and the 4y side of the output end of the IDT 4A was set at 100, the number of electrodes of the reflectors 4B and 4C was set at 50, and the lengths of electrode fingers opposed to each other in the input side and the output side of electrodes in the IDT 4A were set at 20λ. In addition, the thickness of the piezoelectric layer 3 has been set at 0.3λ (=0.54 μm), the thickness of the intermediate layer 5 has been set at 0.08λ (0.144 μm), and the thickness of the IDT electrode 4 has been set at 0.08λ (0.144 μm).

Figure 7:
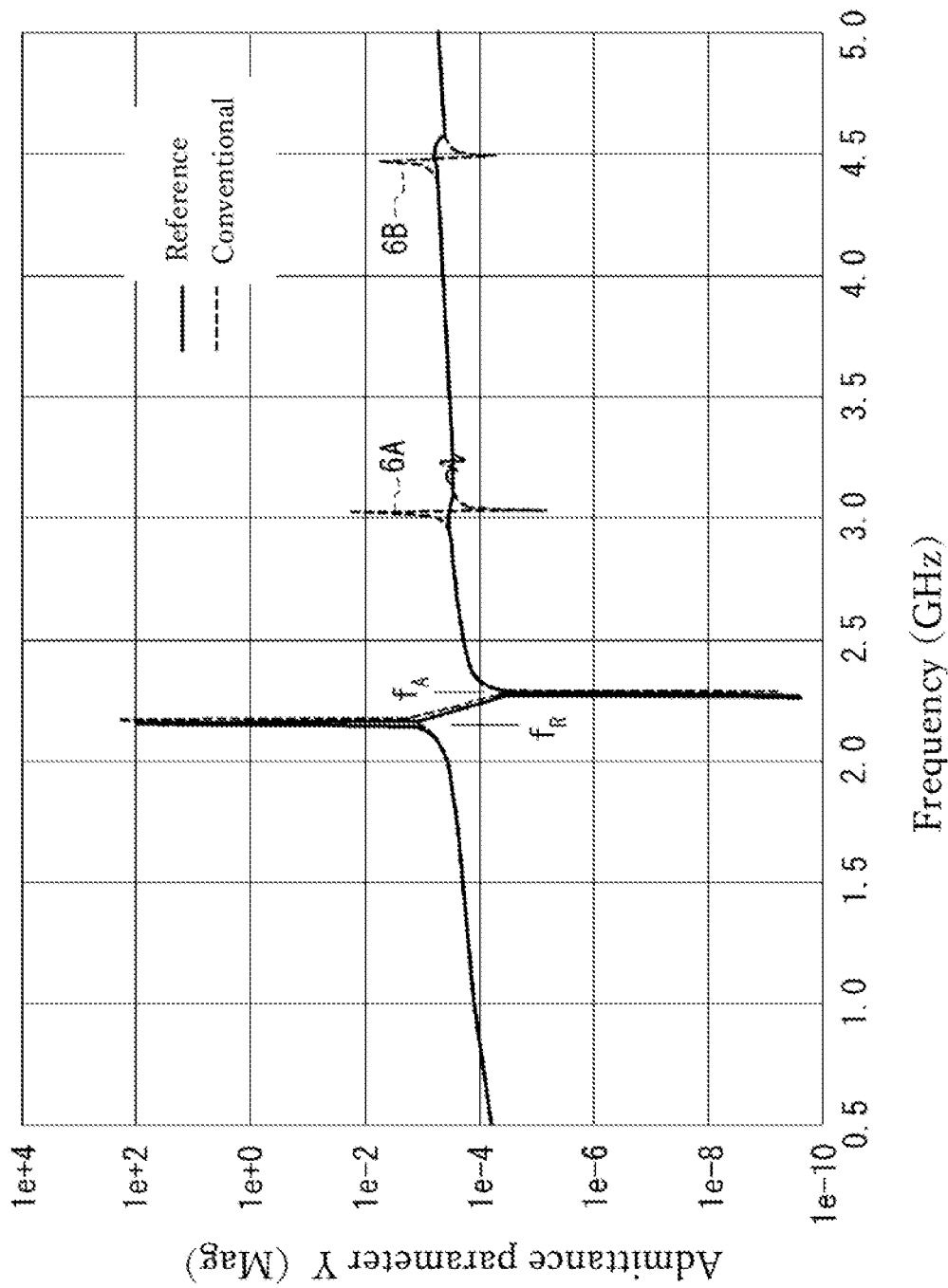
FIG. 7 shows changes in admittance with respect to the frequency of the elastic wave device, regarding one example of the present invention and conventional example in a comparison manner.

FIG. 7 shows a comparison of spurious characteristics between a reference example in which the spurious emission in the high frequency band is reduced and a conventional example in which the spurious emission in the high frequency band is not reduced. FIG. 7 shows the spurious characteristics, in which the horizontal axis represents the frequency (GHz), and the vertical axis represents an admittance parameter Y (Mag). In the conventional example, the Euler angles (φ, θ, ψ) of the crystal orientation of the carrier substrate are (90°, 90°, 0°) with respect to the propagation direction of the elastic wave in the piezoelectric layer 3. The Euler angles (φ, θ, ψ) of this reference example are (135°, 90°, 45°). As are shown by broken lines in FIG. 7, spurious emissions 6A and 6B are formed in bands higher than the resonance frequency $f_R$ and the antiresonance frequency $f_A$, m the conventional elastic wave device. On the other hand, in this reference example, the crystal orientation of the carrier substrate 2 is specified as described above, and thereby, it is possible to reduce the spurious emission to be smaller than the spurious emissions 6A and 6B of the conventional example, or to substantially eliminate the spurious emission, as is shown by the solid line in FIG. 7.

In this way, when the crystal orientation of the carrier substrate 2 is set as in the above description, with respect to the propagation direction (the left-right direction in FIG. 1) of the surface acoustic wave in the piezoelectric layer 3, unnecessary vibrations of the SV mode and the vertical L-mode, which are generated in addition to the surface elastic wave of the main vibration of the SH mode, which should originally propagate, are absorbed by the carrier substrate 2, and the propagation thereof is reduced. Because of this, the spurious emissions 6A and 6B in the high frequency band are reduced.

Figure 8:
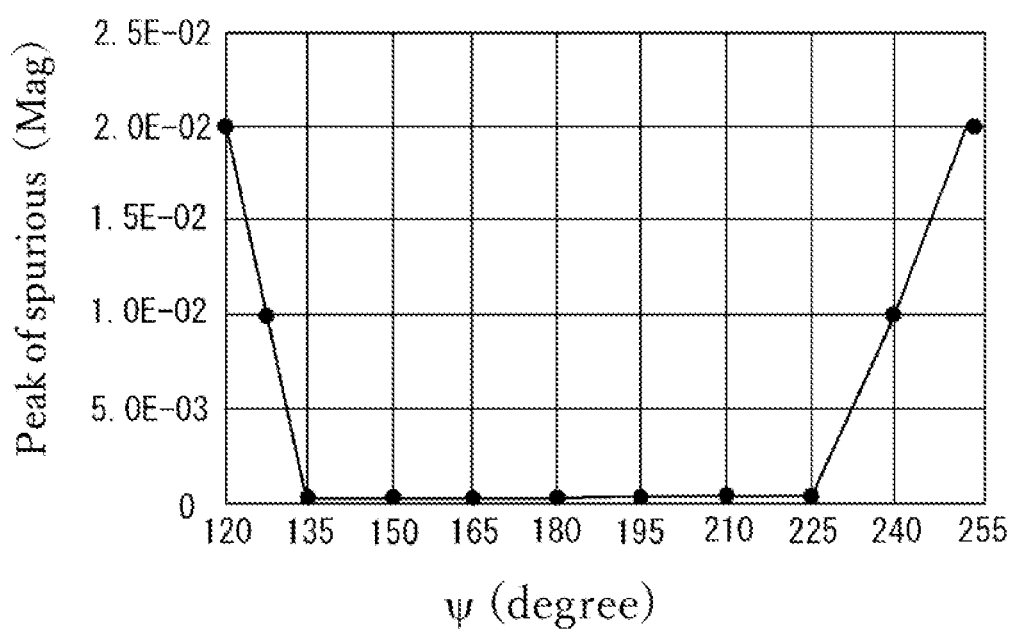
FIG. 8 shows a change of peak of the spurious emission in the high frequency band with respect to the crystal orientation when the crystal orientation is changed, and silicon is used as the carrier substrate.

Next, FIG. 8 shows a result of having examined a reduction effect of the spurious emission in the high frequency band by simulation, by setting the Euler angles (φ, θ, ψ) of the carrier substrate 2 to (φ=135°, 90°, ψ) in the structure of the carrier substrate 2, the piezoelectric layer 3, the IDT electrode 4 and the intermediate layer 5 shown in the above example, as one example, and by changing ψ. As is clear from FIG. 8, it has been found that when non-amorphous silicon is used for the carrier substrate 2 and ψ is set in a specific range, the spurious emission in the high frequency band is effectively reduced.

Next, by simulation, the crystal orientation of the silicon to be used for the carrier substrate 2 was variously changed so as to be different from that in the above example, and changes of a peak of the spurious emission in the high frequency band with respect to the crystal orientation in the carrier substrate 2 were obtained, in notation of the above Euler angles (φ, θ, ψ) of the (z, x, z) form. The results are shown in FIGS. 9A to 9D.

In FIGS. 9A to 9D, when the magnitude of the spurious response is represented by ΔY and a state in which the spurious emission is not observed is ΔY=1, the outer circumference of the circle is a region in which the value of 1/ΔY becomes 1, and is a region in which the spurious emission is suppressed. On the other hand, the center of the circle is a region in which the value of 1/ΔY is very close to 0 and ΔY is large, and is a region in which the spurious emission cannot be suppressed. Here, the value of 1/ΔY is used as such an index that the spurious emission is satisfactorily reduced, and is determined to be 0.1 or more. In each figure, an angle range for obtaining this value is as follows.

Figure 9A:
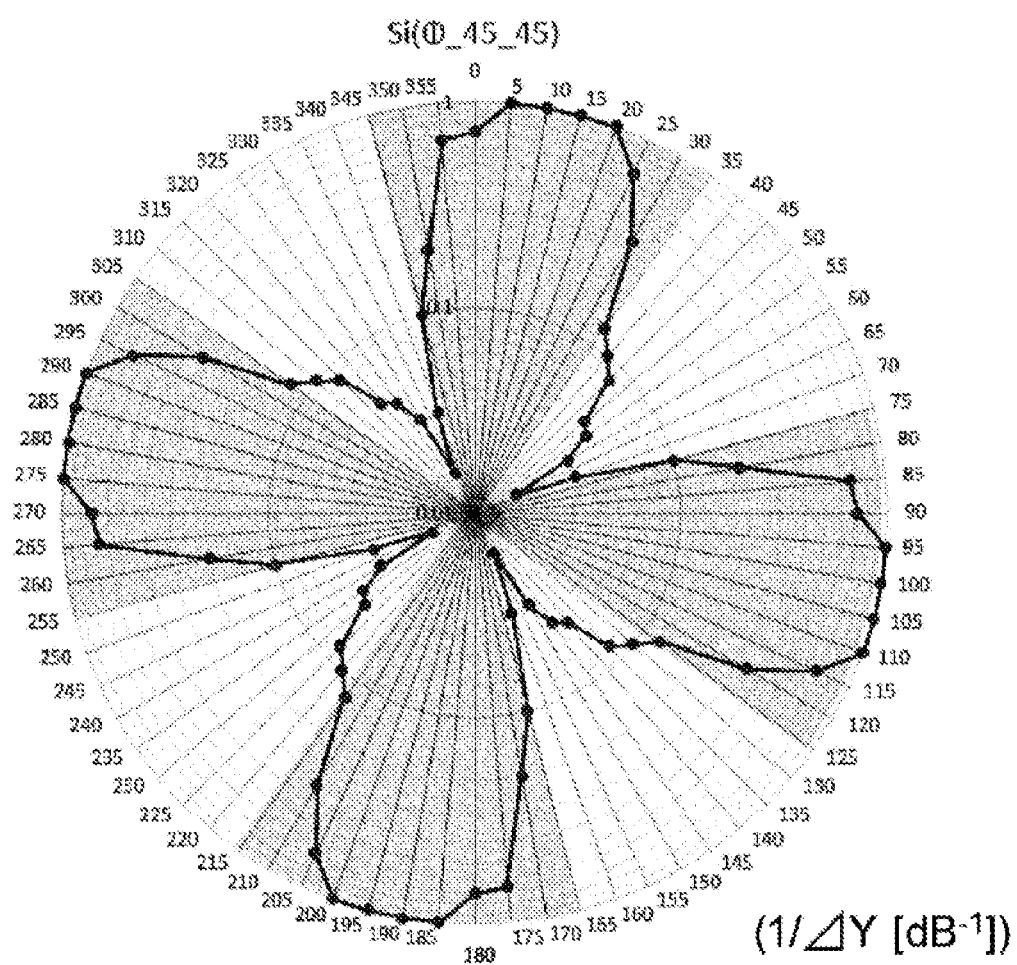
FIG. 9A is a graph showing an example of the relationship between Euler angles and the reduction of the spurious emission of the present invention.

In FIG. 9A. θ=45° and ψ=45°. From FIG. 9A, when the φ is in a range satisfying φ=10°+90°×n±25° (n: integer, hereinafter the same), the value of 1/ΔY can be controlled to 0.1 or more, which is preferable from the viewpoint of reducing the spurious emission.

Hereinafter, in the Euler angles shown in FIGS. 9B to 9D, the respective suitable angle ranges are obtained which are shown below.

Figure 9B:
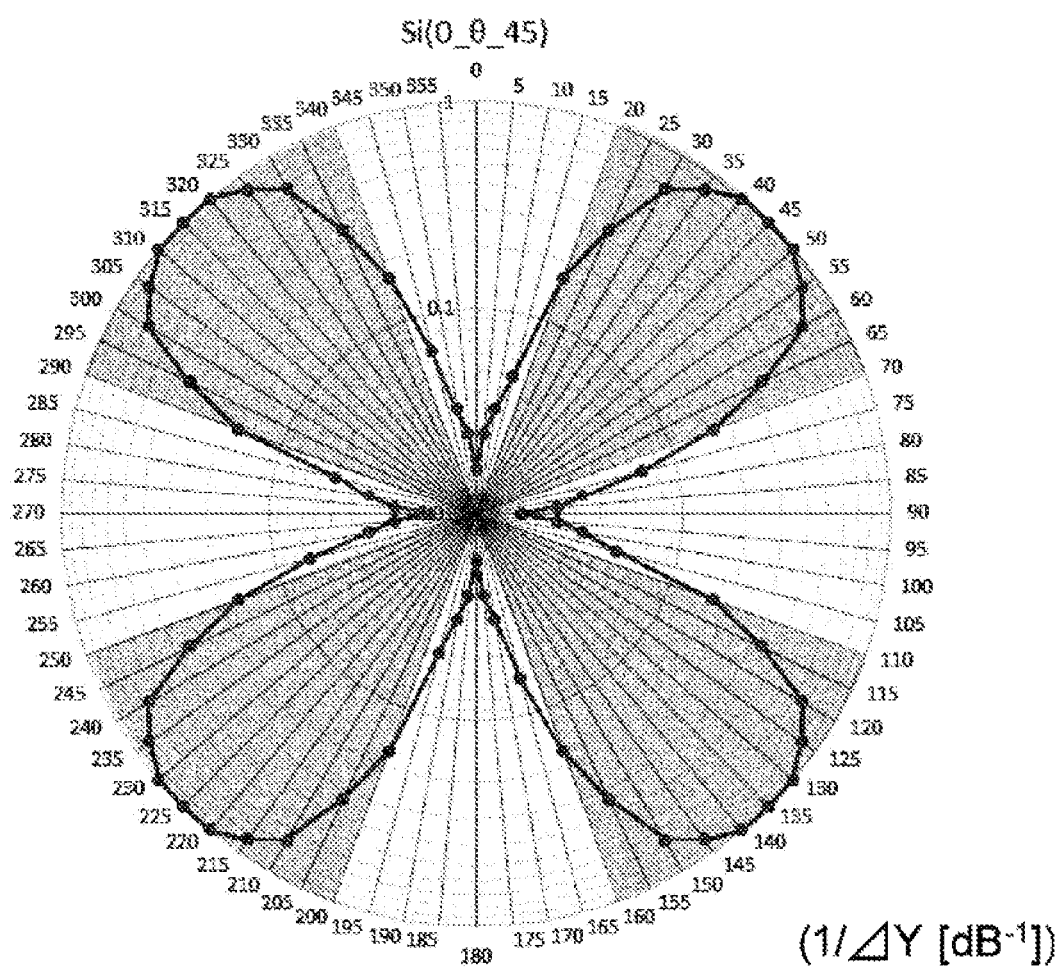
FIG. 9B is a graph showing another example of the relationship between Euler angles and the reduction of the spurious emission of the present invention.

In FIG. 9B, φ=0° and ψ=45°. In this case, it is preferable to be in a range satisfying θ=45°+90°×n±25°.

Figure 9C:
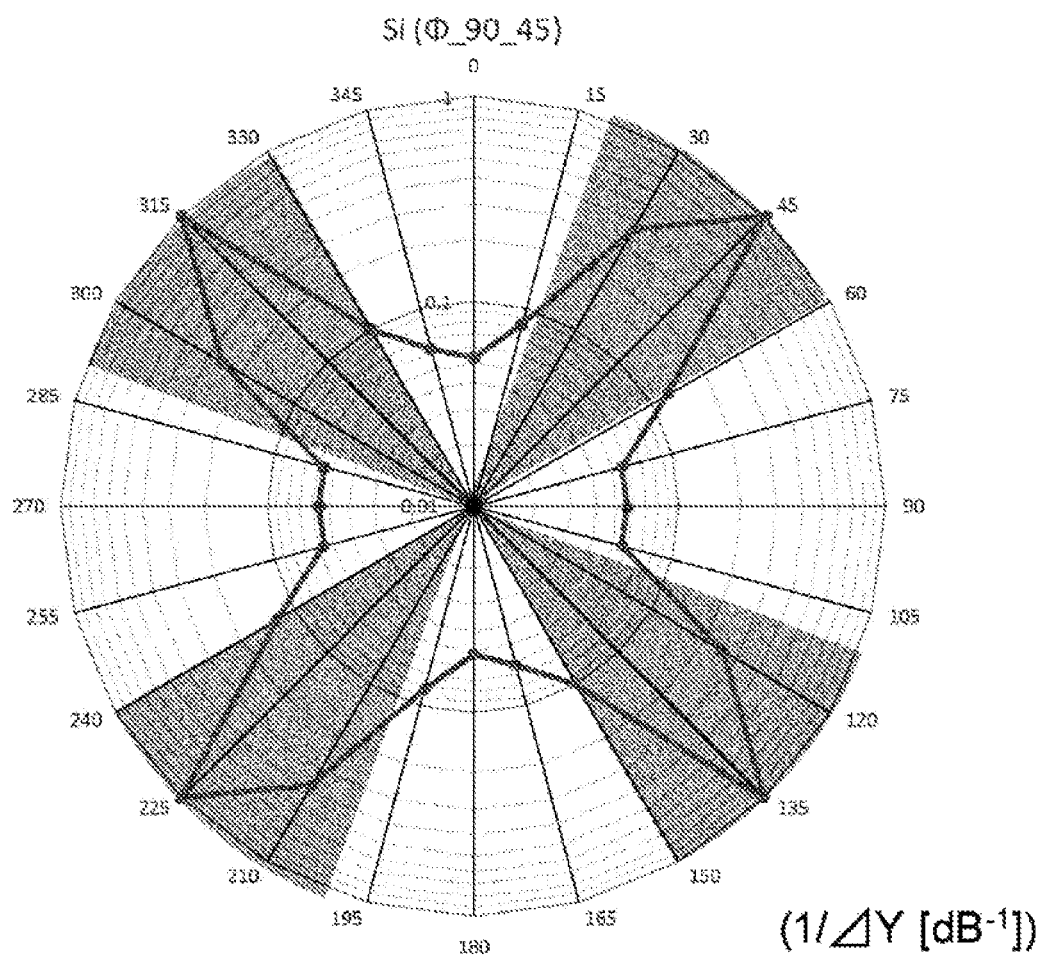
FIG. 9C is a graph showing another example of the relationship between Euler angles and the reduction of the spurious emission of the present invention.

In FIG. 9C, θ=90° and ψ=45°. In this case, it is preferable to be in a range satisfying φ=42.5°+90°×n±22.5°.

Figure 9D:
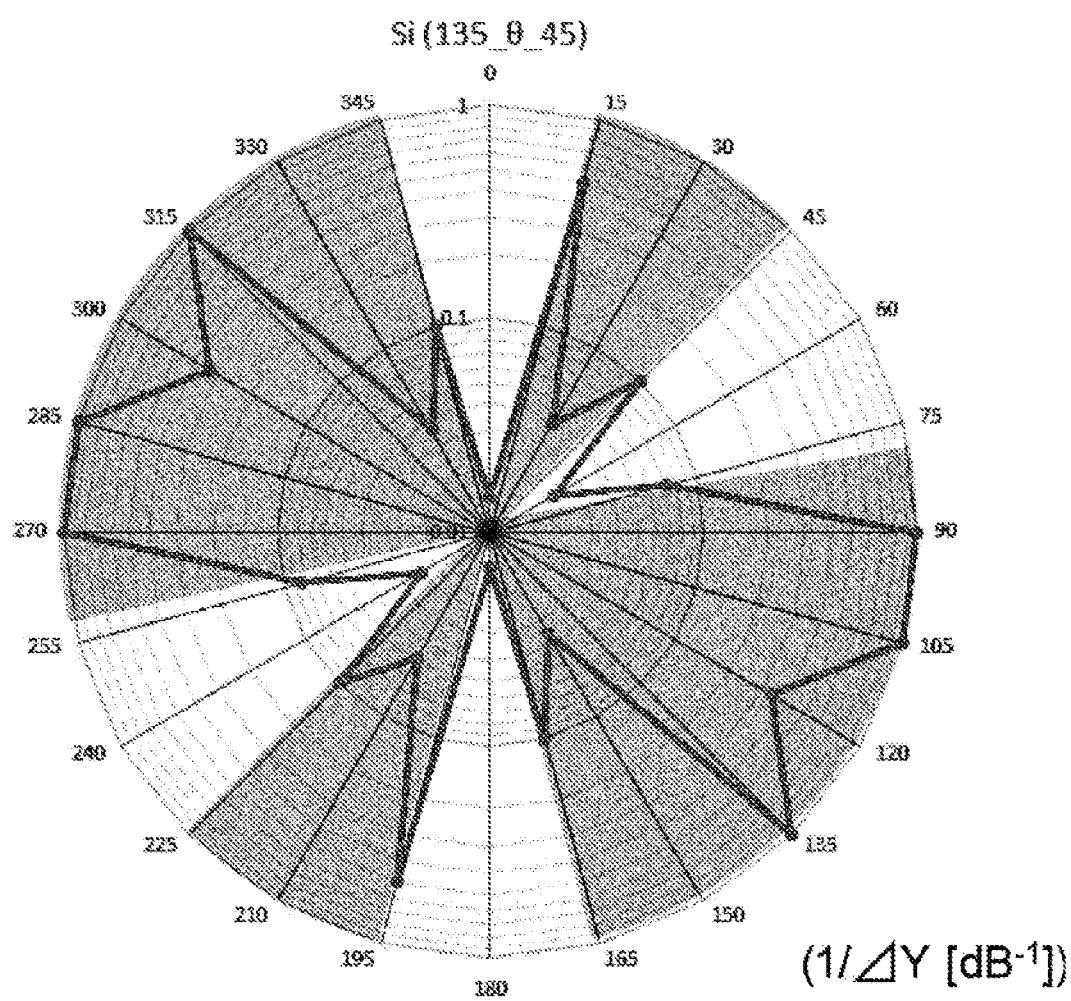
FIG. 9D is a graph showing another example of the relationship between Euler angles and the reduction of the spurious emission of the present invention.

In FIG. 9D, φ=135° and ψ=45°. In this case, it is preferable to be in a range satisfying θ=30°+180°×n±15°, or θ=122°+180°×n±43°.

In addition to the above examples, Euler angles suitable for reducing the spurious emission in the high frequency band in the crystal orientations shown in Table 1 were obtained by simulation. In Table 1, the crystal orientation shown in the left column corresponds to the Euler angles shown in the right column. With respect to the crystal orientation shown in the left column, the angles a and b in the right column are angles at which the crystal faces are in a front-back relationship. Results of having obtained Euler angles suitable for reducing the spurious emission in the high frequency band will be described below.

TABLE 1

| Plane orientation | Euler Angles (ø, θ) |
| --- | --- |
| (1 0 1) | a (90, 45), b (−90, −45) |
| (1 0 −1) | a (90, −45), b (−90, 45) |
| (0 1 1) | a (0, −45), b (180, 45) |
| (0 1 −1) | a (0, 45), b (180, −45) |

Figure 10:
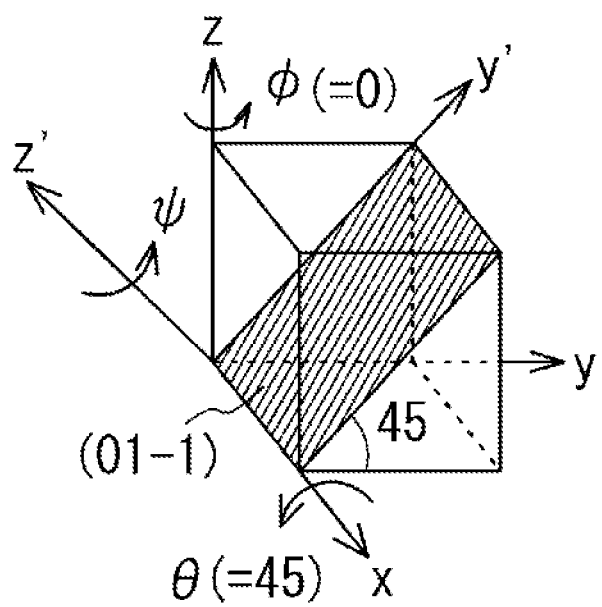
FIG. 10 is a diagram showing another example of the crystal orientation of the carrier substrate according to present invention.
Figure 11A:
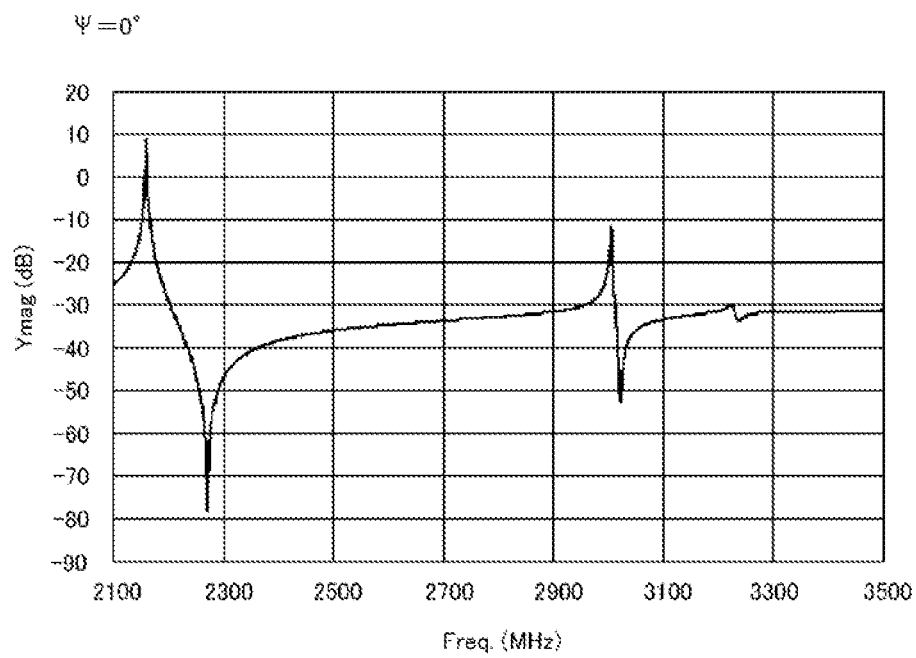
FIG. 11A is a graph showing the degree of reduction of the spurious emission in the high frequency band with regard to the elastic wave device having a carrier substrate of FIG. 10, in the case where the angle ψ of Euler angle is 0°.
Figure 11B:
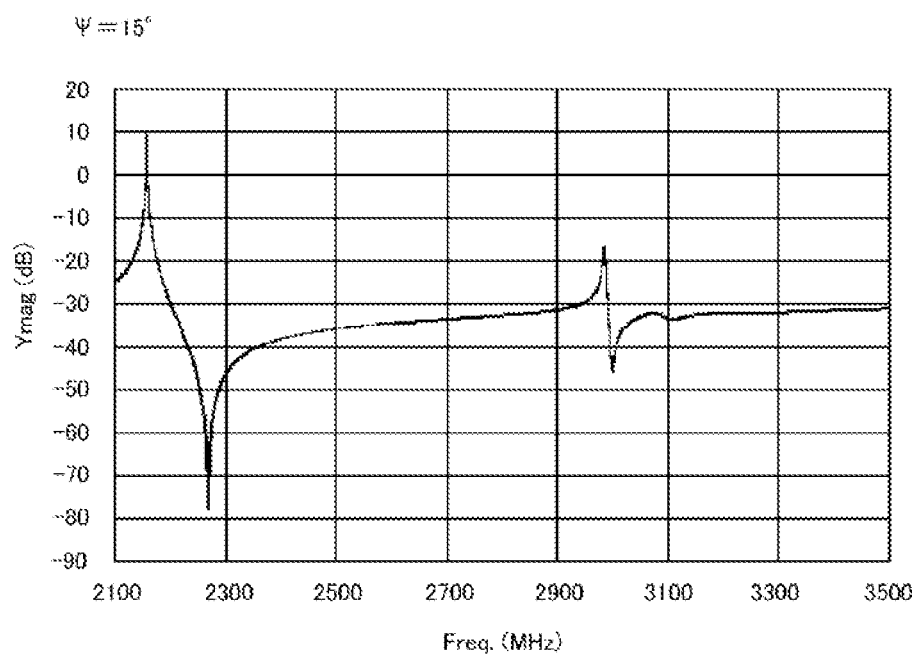
FIG. 11B is a graph showing the degree of reduction of the spurious emission in the high frequency band with regard to the elastic wave device having a carrier substrate of FIG. 10, in the case where the angle w of Euler angle is 15°.
Figure 12A:
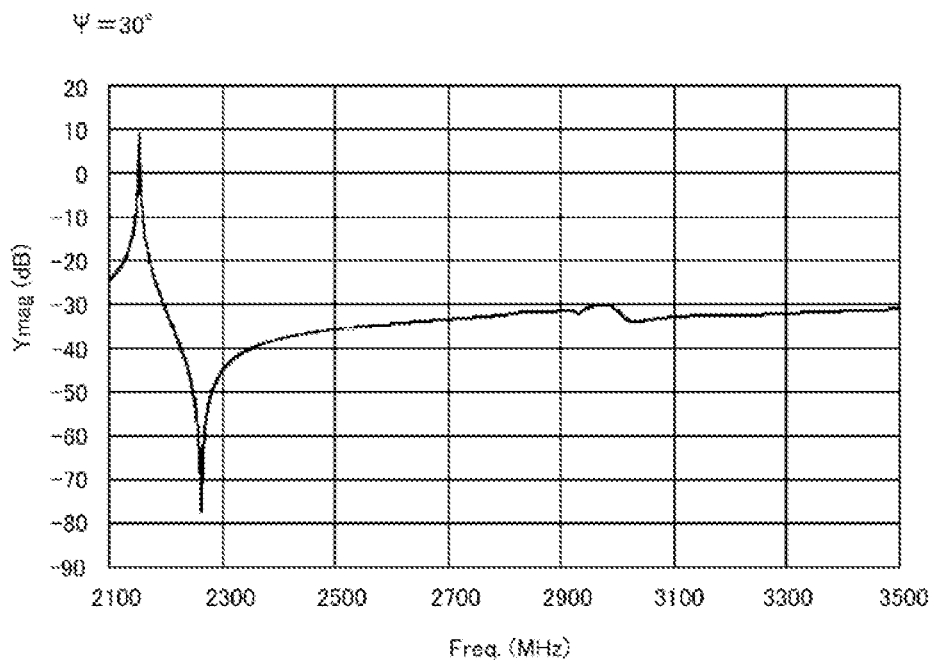
FIG. 12A is a graph showing the degree of reduction of the spurious emission in the high frequency band with regard to the elastic wave device having a carrier substrate of FIG. 10, in the case where the angle ψ of Euler angle is 30°.
Figure 12B:
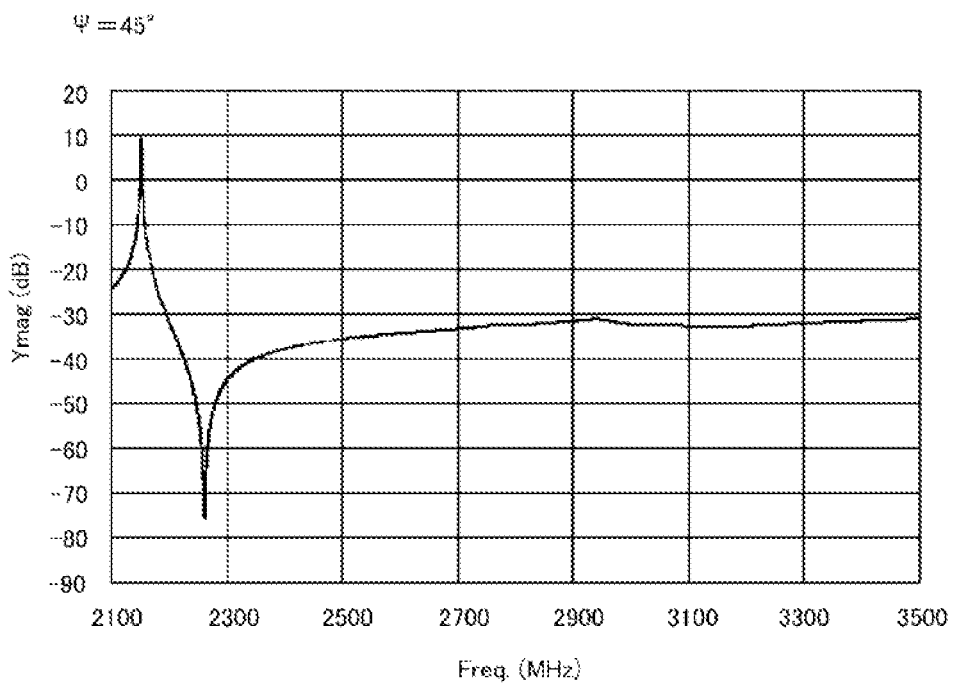
FIG. 12B is a graph showing the degree of reduction of the spurious emission in the high frequency band with regard to the elastic wave device having a carrier substrate of FIG. 10, in the case where the angle ψ of Euler angle is 45°.
Figure 13A:
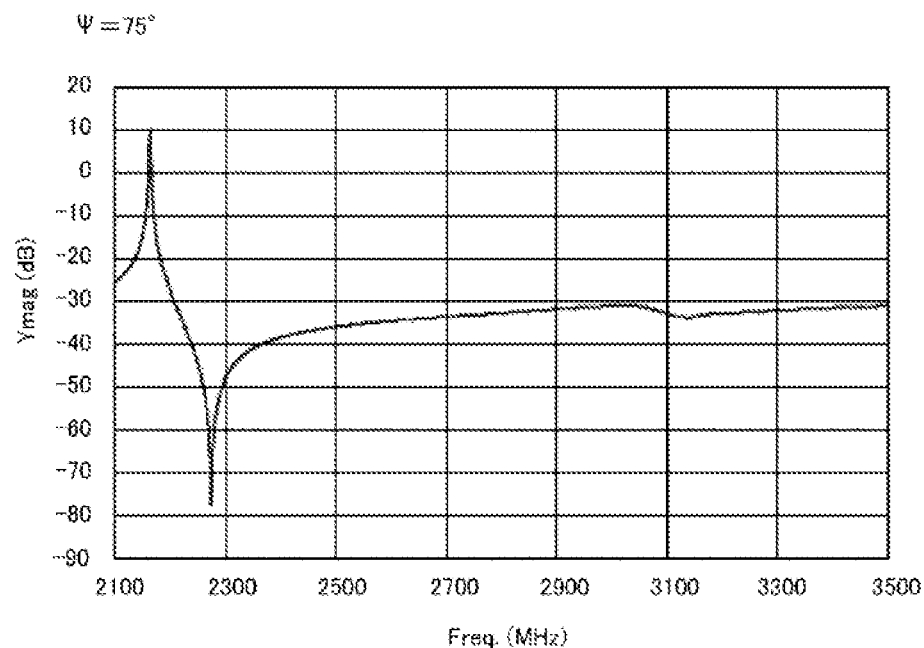
FIG. 13A is a graph showing the degree of reduction of the spurious emission in the high frequency band with regard to the elastic wave device having a carrier substrate of FIG. 10, in the case where the angle ψ of Euler angle is 75°.
Figure 13B:
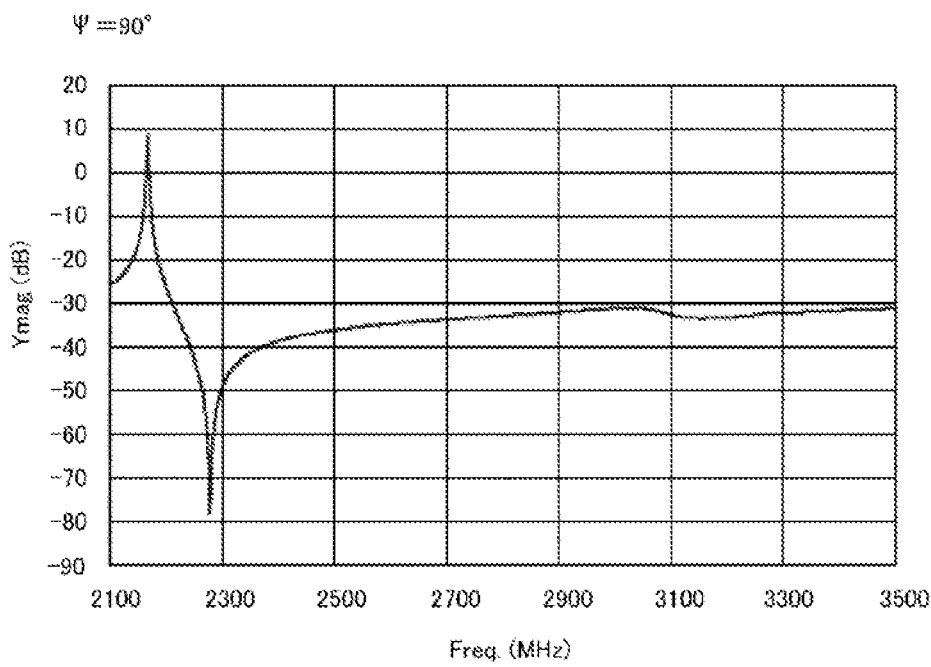
FIG. 13B is a graph showing the degree of reduction of the spurious emission in the high frequency band with regard to the elastic wave device having a carrier substrate of FIG. 10, in the case where the angle ψ of Euler angle is 90°.

FIG. 10 shows a (0 1−1) plane as one example of the crystal orientation of the silicon. FIGS. 11 to 13 show the results of having determined the changes in admittance with respect to the frequency, in the case where the angle of ψ has been changed in the carrier substrate having Euler angles (φ, θ, ψ)=(0°, 45°, ψ) in a crystal orientation (0 1 −1). In determining this change in the admittance, the electrode cycle, the numbers of IDT electrodes and reflector electrodes, the lengths of the electrode fingers of the IDT electrodes, the thickness of the piezoelectric layer 3, the thickness of the intermediate layer 5, and the thickness of the IDT electrodes 4 were set as described above.

FIGS. 11 to 13 show a range in which ψ is 0 degrees to 90 degrees, but in a range in which V is 90 degrees to 180 degrees, the similar results as those in FIGS. 11 to 13, specifically, the similar results concerning the change in the admittance with respect to the frequency are obtained. For example, in the case of ψ=0°, the same result as ψ=180° is obtained. Similarly, for example, in the case of ψ=30° the same result as ψ=150° is obtained. Furthermore, in a range in which ψ is 180° to 360°, the similar result as that in the range in which ψ is 0° to 180° is obtained.

Also concerning crystal orientations (1 0 1), (1 0 −1), and (0 1 1) shown in Table 1, as for the relationship between the frequency and the admittance in the case where the angle of ψ has been changed by 360 degrees, similar results to the results shown in FIGS. 11 to 13 are obtained.

Figure 14:
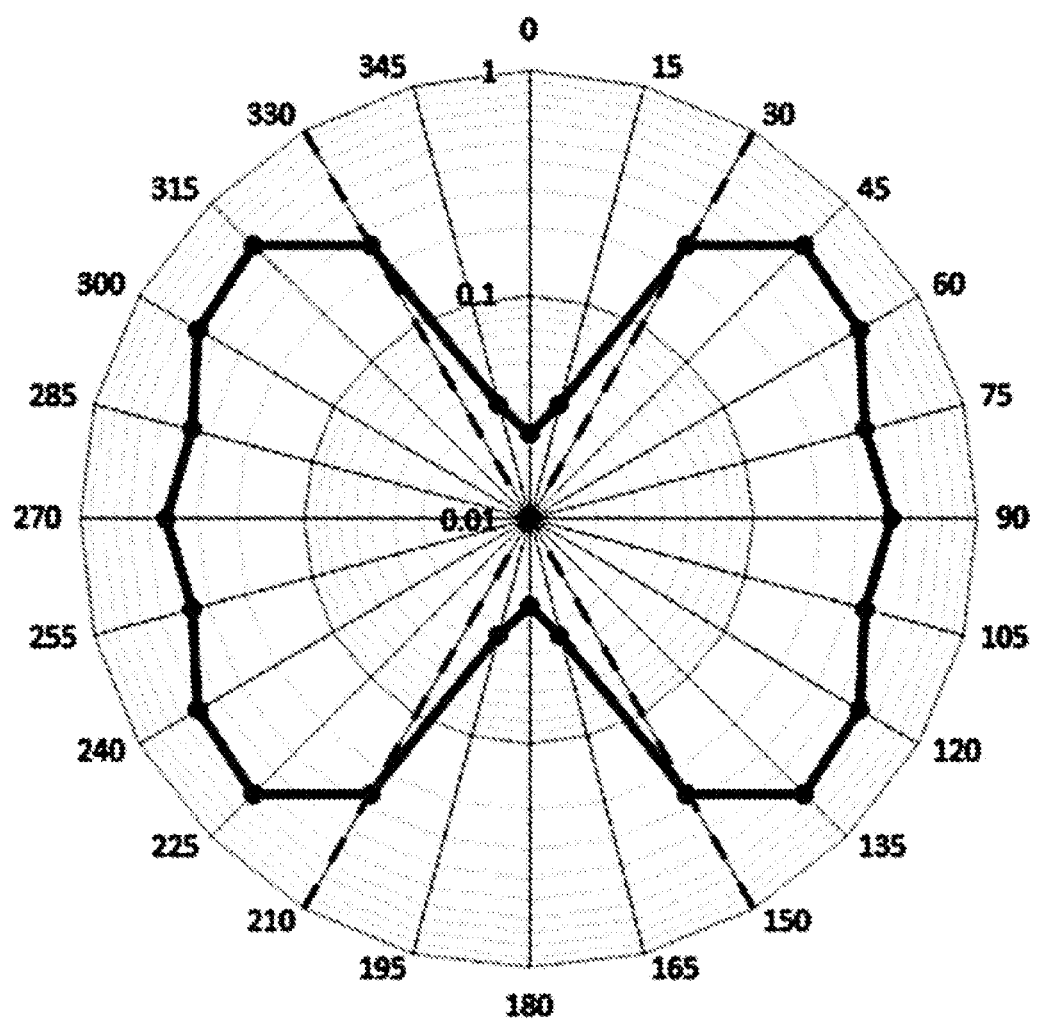
FIG. 14 is a graph showing the relationship between the Euler angle and the reduction of the spurious emission in the elastic wave device having a carrier substrate of FIG. 10.

The relationship between the Euler angle and the suppression of the spurious emission in each of the crystal orientations shown in Table 1 is commonly shown by a graph of FIG. 14. As is shown in FIG. 14, in order to reduce the spurious emission, it is preferable to set ψ to be 30°≤ψ≤150°, or to be 210°≤ψ≤330°. The angle ψ shall be within a range between the maximum and minimum values determined by the expression (1).

$$\psi = 90° + 180° \times n \pm 60° \quad \text{(1)(n: integer)}$$

However, as shown in FIG. 6, the elastic wave device is obtained by an actual bonding angle between the piezoelectric layer 3 and the carrier substrate 2. At the time of this bonding, as for the angle ψ, a difference between a design angle and an angle obtained by the actual bonding occurs due to a manufacturing error, in some cases. In order to prevent a range of the angle ψ from deviating from a preferable range because of such a manufacturing error, it is more preferable to set a range of y to a range determined by the expression (2).

$$\psi = 90° + 180° \times n \pm 25° \quad \text{(2)(n: integer)}$$

As described above, in the elastic wave device having a structure in which lithium tantalate is used for the piezoelectric layer 3, silicon dioxide is used for the intermediate layer 5, and silicon is used for the carrier substrate 2, it is preferable to set the thickness of the piezoelectric layer 3 to 1.5λ or less. This is because if the thickness of the piezoelectric layer 3 becomes larger than 1.5λ, a guiding action of guiding the surface elastic wave along the piezoelectric layer 3, which is caused by thinning the piezoelectric layer 3, decreases, and the Q value results in decreasing.

Figure 15:
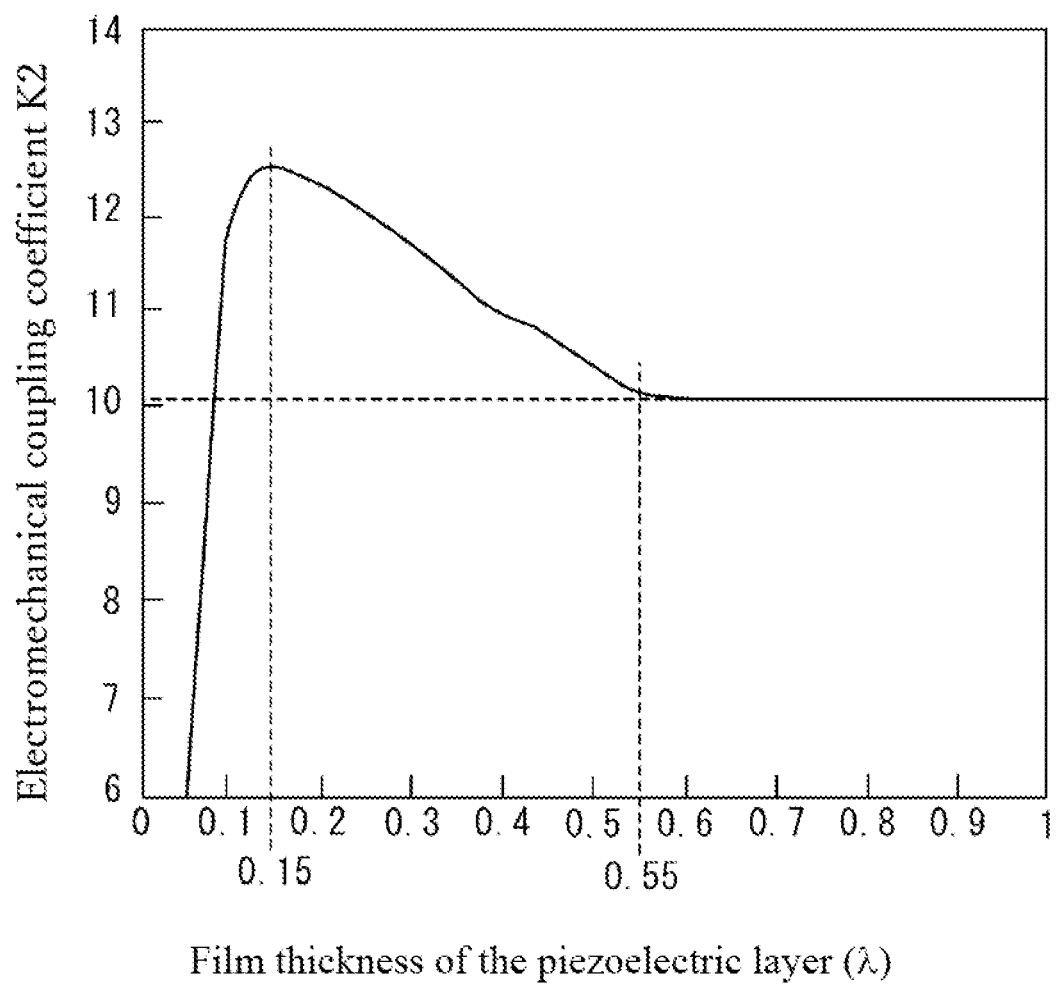
FIG. 15 shows changes in electromechanical coupling coefficient when the film thickness of the piezoelectric layer was changed in one example of elastic wave device of the present invention.

In addition, it is preferable to set the thickness of the piezoelectric layer 3 to 0.15λ or more, by the following reason. FIG. 15 shows a simulation result of changes in electromechanical coupling coefficient K2 (%), when the film thickness λ of the piezoelectric layer 3 was changed, in the case where LT of 42° Y-cut X-propagation was used for the piezoelectric layer 3, silicon dioxide was used for the intermediate layer 5, and silicon was used for the carrier substrate 2. As is shown in FIG. 15, in the case where the piezoelectric layer 3 is provided on the carrier substrate 2 via the intermediate layer 5 having a thickness of 0.08λ as described above, the electrical coupling coefficient K2 exhibits a peak, when the thickness of the piezoelectric layer 3 is 0.15λ; but when the thickness becomes smaller than 0.15λ, the change in the electromechanical coupling coefficient K2 starts to greatly deteriorate, and accordingly, the characteristics become unstable, which leads to a decrease in the yield. Accordingly, it is preferable that the thickness of the piezoelectric layer 3 is 0.15λ or more.

In addition, as is shown in FIG. 15, when the thickness of the piezoelectric layer 3 is set to 0.15λ or more and 0.55ψ or less, the electromechanical coupling coefficient K2 (%) becomes larger than that in the case of only the piezoelectric layer 3, and results in the improvement of the Q value, and accordingly, it is more preferable to set the thickness of the piezoelectric layer 3 in this range.

In the above example, the case has been described where silicon dioxide is used for the intermediate layer 5, but when a material for speeding up the speed of propagation of the elastic wave, such as aluminum nitride or aluminum boron nitride, is used for the intermediate layer 5, it becomes possible to enhance the propagation speed of the surface elastic wave to be propagated, and to improve characteristics at higher frequencies.

Figure 16A:
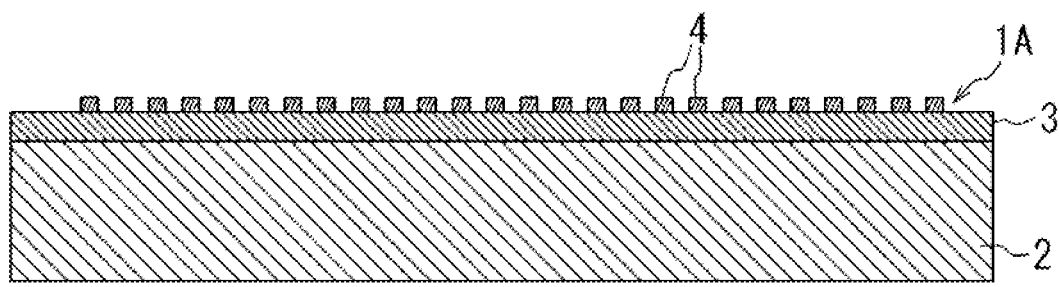
FIG. 16A is a cross-sectional view showing another embodiment of the elastic wave device according to the present invention.

FIG. 16A is a cross-sectional view showing another embodiment of the elastic wave device according to the present invention. In an elastic wave device 1A of this embodiment, the intermediate layer 5 is eliminated, and the piezoelectric layer 3 and the carrier substrate 2 are directly bonded to each other. Also in this case, the effect of improving the Q value by the guiding action of the surface elastic wave, which is caused by thinning the piezoelectric layer 3, is obtained as in the case where the intermediate layer is provided. However, depending on a material of the carrier substrate 2, there is a possibility that the effect is inferior to that in the case where there is an intermediate layer. In addition, by using the carrier substrate 2 of the material and the crystal orientation as described above, the carrier substrate 2 can absorb the unnecessary vibrations, which can similarly provide the effect of reducing the spurious emission in the high frequency band.

Figure 16B:
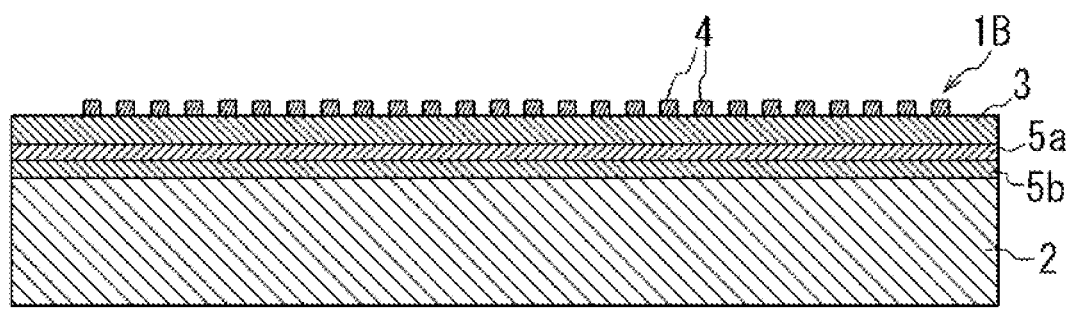
FIG. 16B is a cross-sectional view showing another embodiment of the elastic wave device according to the present invention.

FIG. 16B is a cross-sectional view showing another embodiment of the elastic wave device according to the present invention. In an elastic wave device 1B of this embodiment, two layers of a first layer 5a and a second layer 5b are provided as the intermediate layer. In this example, a speeding up layer can be used as the first layer 5a, and a layer for strengthening the bonding can be used as the second layer 5b. Specifically, aluminum nitride, aluminum boron nitride or the like is used for the first layer 5a, and silicon dioxide or the like is used for the second layer b and thereby the effects of improving the Q value and improving the bonding strength can be obtained. In addition, it is also possible to use silicon dioxide as the first layer 5a, and to use aluminum nitride, aluminum boron nitride or the like as the second layer 5b. Furthermore, it is also possible to adopt a layer structure of three or more layers as the intermediate layer 5.

Figure 16C:
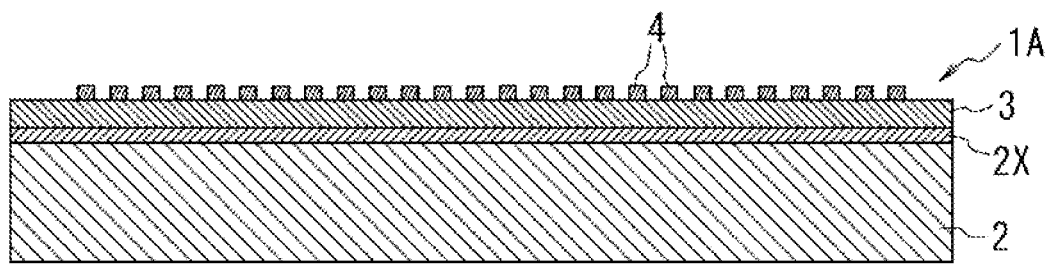
FIG. 16C is a cross-sectional view showing another embodiment of the elastic wave device according to the present invention.

FIG. 16C is a cross-sectional view showing another embodiment of the elastic wave device according to the present invention. In this embodiment, a silicon polycrystalline layer 2X is provided in the bonding layer between the piezoelectric layer 3 and the carrier substrate 2. The silicon polycrystalline layer exists in the bonding layer, thereby provides an effect of reducing a leakage current of high frequency, and provides an effect of suppressing a high-frequency noise, when the piezoelectric layer is thinned to be close to a wavelength of high frequency.

Figure 17A:
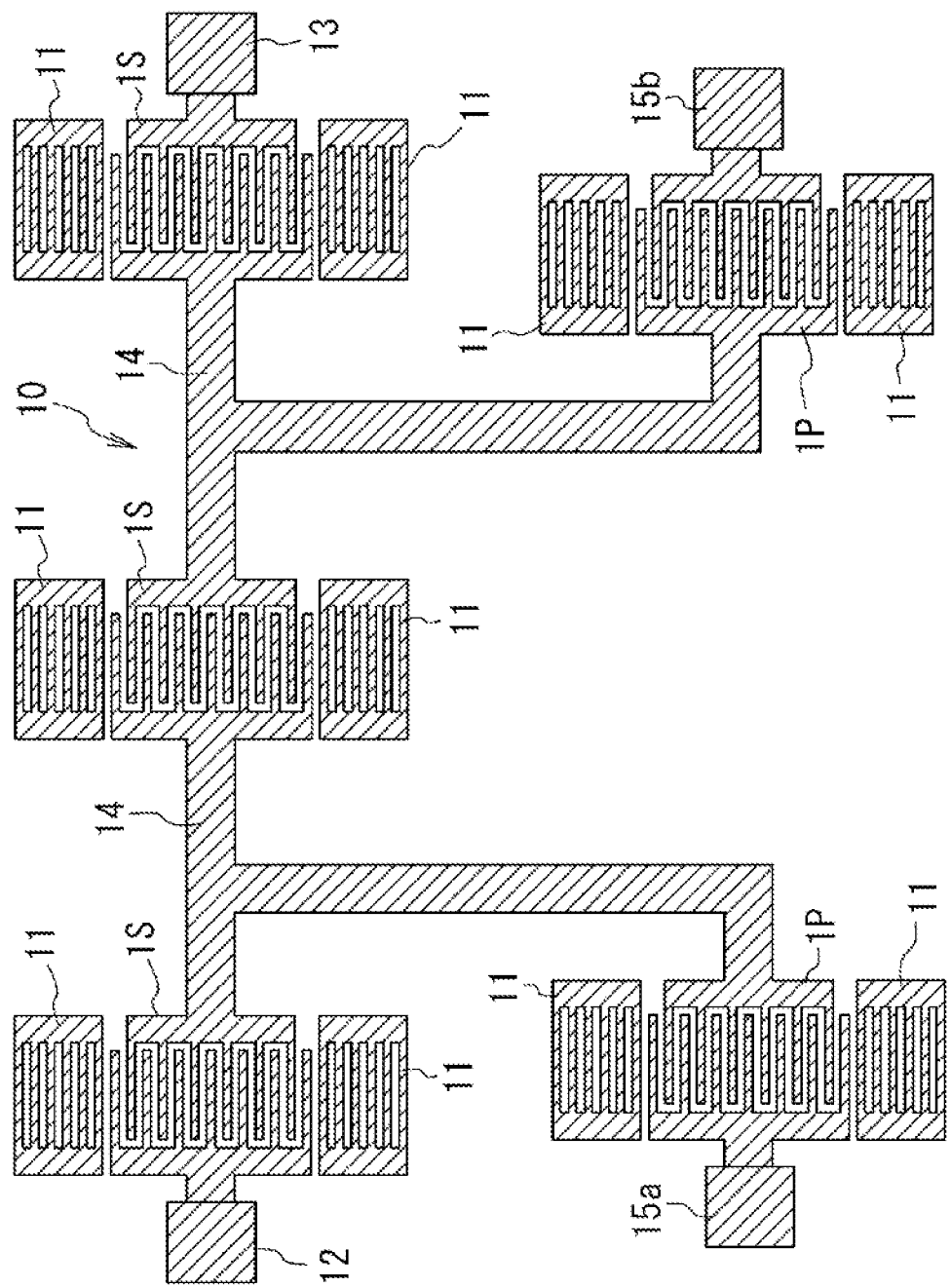
FIG. 17A is a diagram showing one example of an elastic wave filter that is structured by assembling elastic wave devices of the present invention into a ladder structure.
Figure 17B:
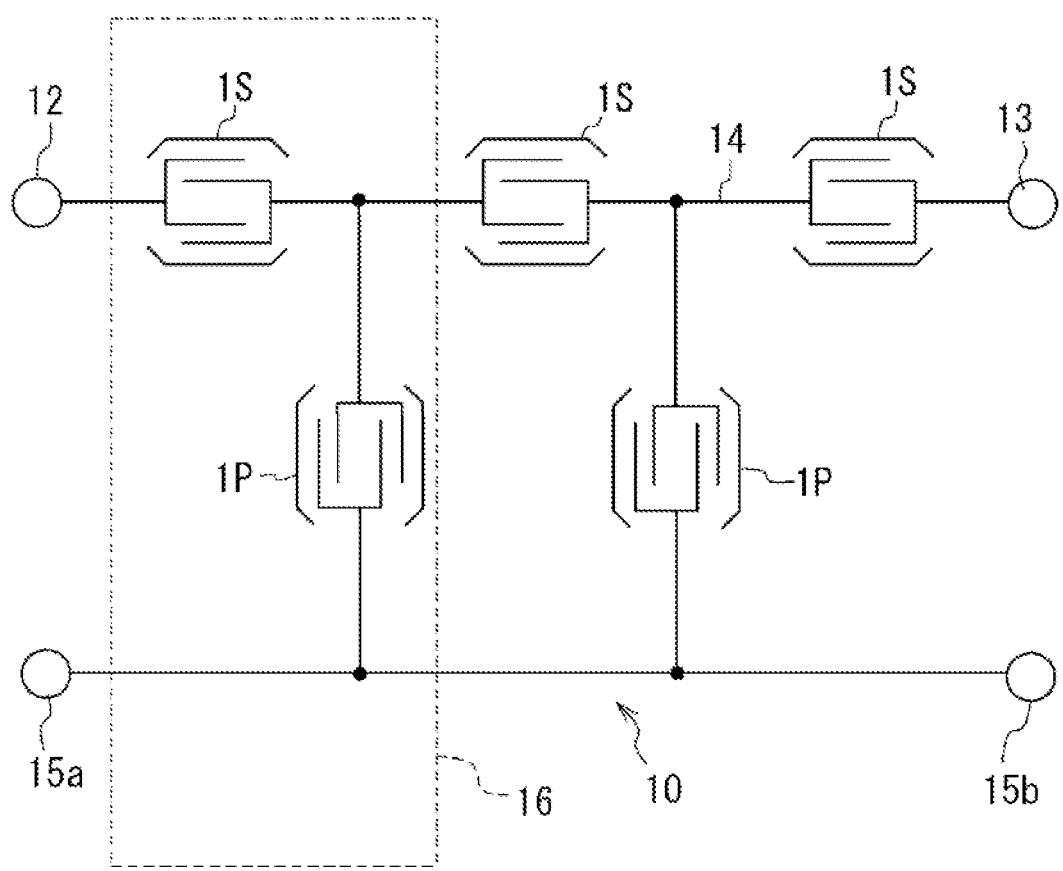
FIG. 17B is a diagram showing a rough sketch of one example of the elastic wave filter according to FIG. 17A.

FIG. 17A and FIG. 17B show one example of an elastic wave filter 10 that is structured by assembling elastic wave devices 1S and 1P into a ladder structure, which have the film thickness of the piezoelectric layer 3 and the selected material and crystal orientation as described above. Each of the elastic wave devices 1S and 1P includes a reflector 11. The elastic wave devices 1S of the elastic wave devices 1S and 1P are inserted in lines 14 between an input port 12 and an output port 13, and the elastic wave devices 1P of the elastic wave devices 1S and 1P are inserted between the lines 14 and the ground ports 15a and 15b, respectively. This elastic wave filter is structured by one elastic wave device 1S and one elastic wave device 1P as a basic unit 16 of a ladder structure, and has a pass band that is determined by an impedance of the elastic wave device 1S and an impedance of the elastic wave device 1P. In the case where the filter is structured by the assembly into the ladder structure as described above, various characteristics can be obtained by variously changing the number of stages and the assembled structure of the ladder.

Figure 18:
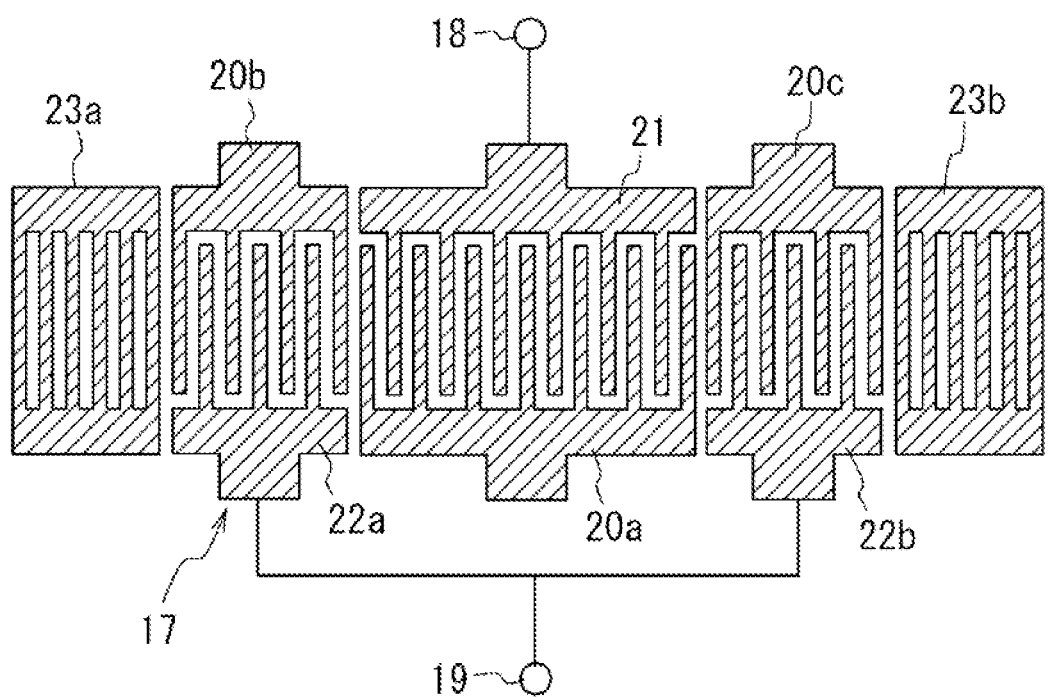
FIG. 18 is a diagram showing one example of an elastic wave filter that is structured by assembling the elastic wave device of the present invention into a DMS structure.

FIG. 18 shows one example of an elastic wave filter 17 that is structured by assembling the elastic wave device 1 of the present invention into a DMS structure. The elastic wave filter 17 includes: an IDT 21 that is provided between an input port 18 and a ground port 20a; IDTs 22a and 22b that are arranged on both sides of the IDT; and reflectors 23a and 23b that arranged adjacent to the IDTs 22a and 22b, respectively. The IDTs 22a and 22b are arranged between the ground ports 20b and 20c and the output port 19, respectively. Also, in the case where the filter having the DMS structure is structured, the assembly structure of the IDT electrode is not limited to this example, and can be variously changed.

As shown in FIG. 17A, FIG. 17B, or FIG. 18, the elastic wave filters 10 and 17 are structured by the elastic wave device according to the present invention, and thereby elastic wave filters 10 and 17 can be realized in which the spurious emission in the high frequency band is reduced.

Figure 19:
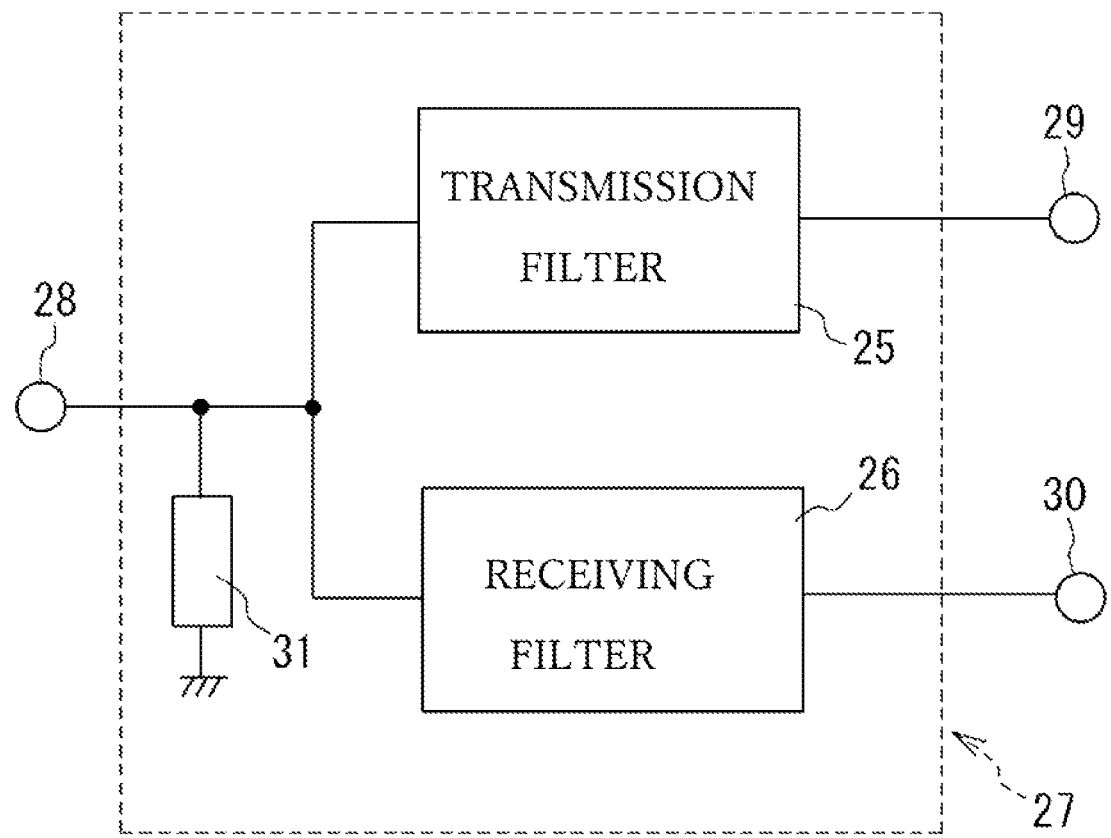
FIG. 19 is a diagram showing one example of a duplexer that uses the elastic wave device according to the present invention.

FIG. 19 shows one example of a duplexer 27 that uses a transmission filter 25 and a receiving filter 26 which are structured by using the elastic wave filter according to the present invention, which is structured, for example, as shown in FIG. 17A. FIG. 17B or FIG. 18. This duplexer 27 is used in mobile communication equipment in which a frequency band of a transmission signal and a frequency band of a reception signal are close to each other. The transmission filter 25 is inserted between an antenna port 28 which is connected to an unillustrated antenna and a transmission circuit connection port 29 winch is connected to an unillustrated transmission circuit. The receiving filter 26 is inserted between the antenna port 28 and a reception circuit connection port 30 that is connected to an unillustrated reception circuit. The antenna port 28 and the ground are connected by an appropriate impedance element 31, and this element 31 is also included in a part of the duplexer 27. In this way, the duplexer 27 is structured by using the elastic wave filter of the present invention, and thereby the duplexer 27 can be realized in which the spurious emission in the high frequency band is reduced.

Figure 20:
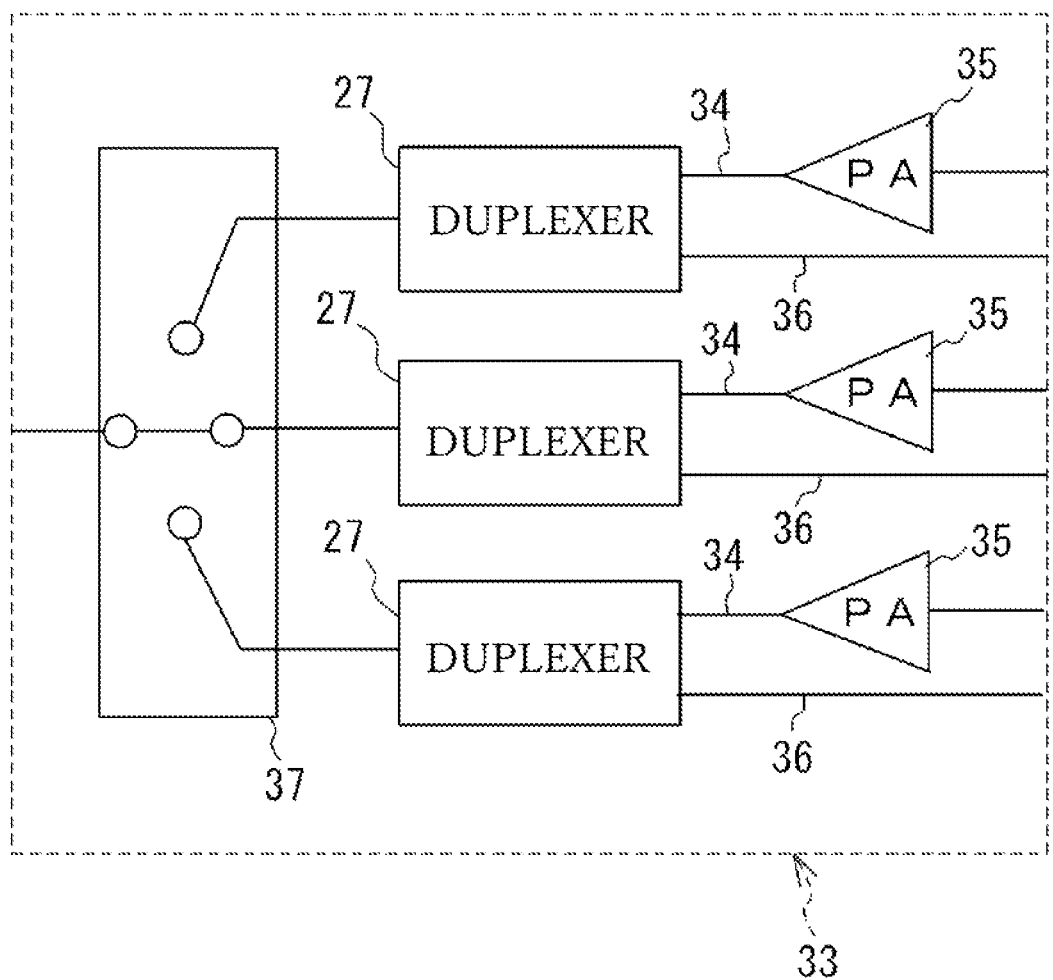
FIG. 20 is a diagram showing one example of a module that is structured by using the elastic wave duplexer according to the present invention.

FIG. 20 shows one example of a module 33 that is structured by using the duplexer 27 according to the present invention. This module 33 is used for mobile communication equipment that handles a plurality of different transmission/reception signals. The module 33 is structured so as to include: a plurality of duplexers 27 shown in FIG. 19; power amplifiers 35 that are inserted in transmission circuits 34 which are provided so as to correspond to the duplexers 27, respectively; and reception circuits 36. A switch circuit 37 is inserted between the plurality of duplexers 27 and an unillustrated antenna port, and this switch circuit 37 is also included in the module 33.

This module 33 may also be structured so as to include another passive element and circuit that become necessary when having a transmission/reception circuit formed therein. In addition, the module 33 may be structured by combining the duplexer 27 with a circuit other than the power amplifier 35.

As is shown in FIG. 20, also in the module 33 that uses the elastic wave device of the present invention, the module 33 can be realized in which the spurious emission in the high frequency band is reduced.

Figure 21:
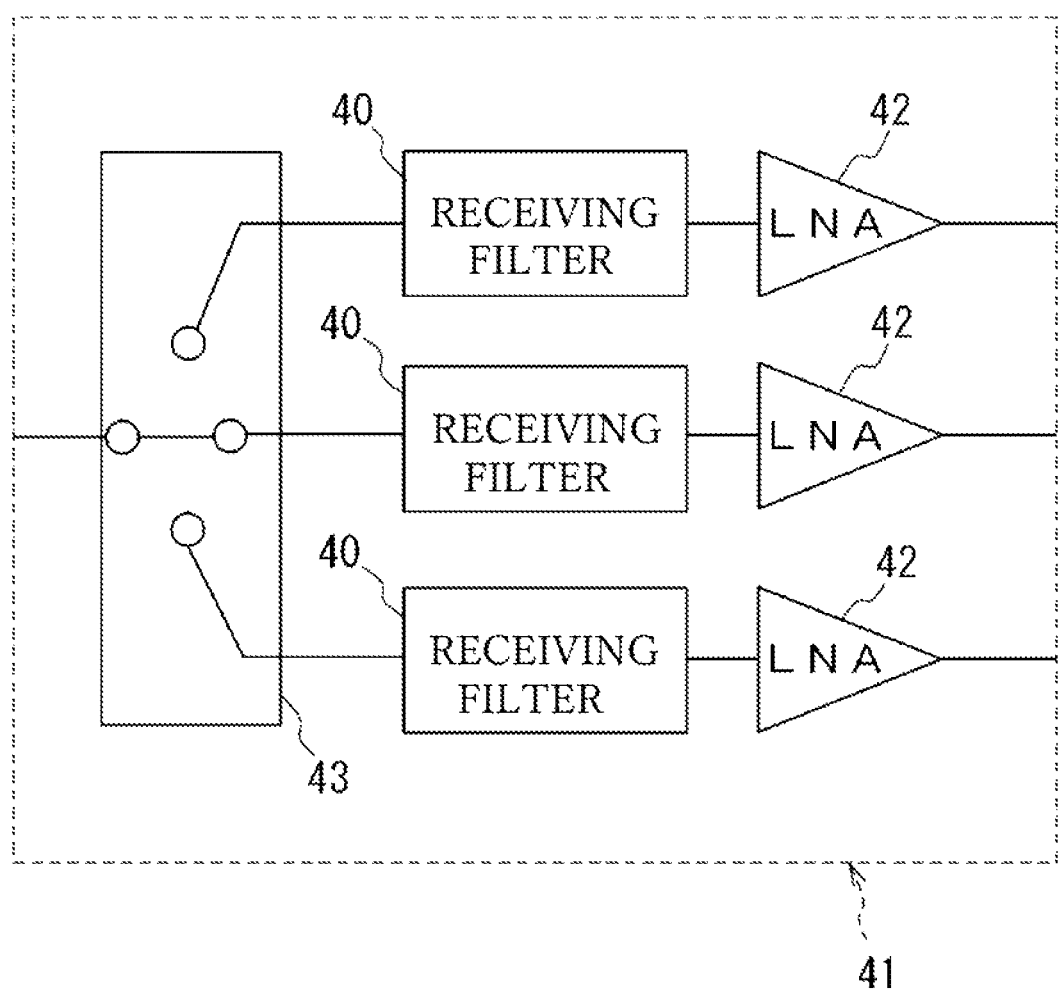
FIG. 21 is a diagram showing one example of a module structured by the elastic wave filter according to the present invention.

FIG. 21 shows one example of a module 41 structured by a receiving filter 40 that uses the elastic wave filter according to the present invention, which is structured, for example, as shown in FIG. 17A. FIG. 17B or FIG. 18. This module 41 is used for mobile communication equipment that handles a plurality of different transmission/reception signals. This module 41 includes: a plurality of receiving filters 40 that have been shown in the elastic wave filter according to the present invention and correspond to frequencies, respectively; low noise amplifiers (LNA) 42 that are provided so as to correspond to the respective receiving filters 40; and a switch circuit 43 that is inserted between the plurality of receiving filters 40 and an unillustrated antenna port.

This module 41 may also be structured so as to include another passive element and circuit that become necessary when having a reception circuit formed therein. In addition, the module 41 may be structured by combination with another circuit.

As is shown in FIG. 21, also in the module 41 that uses the elastic wave filter of the present invention, the module 41 can be realized in which the spurious emission in the high frequency band is reduced.

As having been described the present invention, the above-described embodiments are not restrictive and various changes and additions, such as using the elastic wave device in combination with a BAW resonator other than for an SAW resonator, can be made without departing from the gist of the present invention when the present invention is specifically implemented.

The following aspects are understood from at least one of the above-described embodiments.

One aspect of the elastic wave device is an elastic wave device that excites main vibration of an SH mode and includes: a piezoelectric layer formed from a piezoelectric material; a carrier substrate; and an IDT electrode formed on the piezoelectric layer, wherein when a wavelength of an elastic wave, which is determined by an electrode cycle of the IDT electrode, is represented by $\lambda$, the piezoelectric layer has a thickness of $0.15\lambda$ or more and $1.5\lambda$ or less, and the carrier substrate has an acoustic anisotropy and is arranged in a crystal orientation that reduces unnecessary vibrations of an SV mode and a vertical L-mode. As described above, the thickness of the piezoelectric layer is set to $0.15\lambda$ or more and $1.5\lambda$ or less, and thereby, a high electromechanical coupling coefficient and a high Q value are kept; and at the same time, the crystal orientation of the carrier substrate is selected to an orientation in which the unnecessary vibrations of the SV mode and the vertical L-mode are reduced, and thereby the unnecessary vibrations are reduced and the spurious emission in the high frequency band is reduced.

It is preferable in one aspect of the elastic wave device described above that one or more intermediate layers are provided between the carrier substrate and the piezoelectric layer, which play at least one of roles of facilitating the bonding between the carrier substrate and the piezoelectric layer, and speeding up acoustic velocity of an elastic wave. By having such an intermediate layer, the elastic wave device can enhance the bonding strength between the piezoelectric layer and the carrier substrate, or can acquire an effect of preventing the leakage of the surface elastic wave that should be propagated.

It is preferable in one aspect of the elastic wave device having the intermediate layer described above that a thickness of the piezoelectric layer is $0.15\lambda$ or more and $0.55\lambda$ or less. Due to the thickness of the piezoelectric layer being set in tins way, an elastic wave device can be obtained that has both of a higher electromechanical coupling coefficient and a higher Q value.

It is preferable in one aspect of the elastic wave device described above that the carrier substrate is of silicon having a non-amorphous crystal form, and is preferable to adjust each angle of the crystal orientation in notation of Euler angles ($\phi$, $\theta$, $\psi$) of a (z, x, z) form, with respect to a propagation direction of an elastic wave in the piezoelectric layer, to any one of the following (1) to (6).

$$(\phi, 45°, 45°), \quad (1)$$

$\phi$ is in a range satisfying
$\phi$32 $10°+90°\times n\pm25°$ (n: integer, hereinafter the same).

$$In(0°, \theta, 45°), \quad (2)$$

$\theta$ is in a range satisfying
$\theta=45°+90°\times n\pm25°$.

$$In(\phi, 90°, 45°), \quad (3)$$

$\phi$ is in a range satisfying
$\phi=42.5°+90°\times n\pm22.5°$.

$$In(135°, \theta, 45°), \quad (4)$$

$\theta$ is in a range satisfying
$\theta=30°+180°\times n\pm15°$,
or
$\theta=122°+180°\times n\pm43°$.

$$\begin{aligned}&\text{In } (90°, 45°, \psi), (-90°, 45°, \psi), (90°, -45°, \psi),\\ &(-90°, 45°, \psi), (0°, -45°, \psi), (180°, 45°, \psi),\\ &(0°, 45°, \psi) \text{ or}(180°, -45°, \psi),\end{aligned} \quad (5)$$

$\psi$ is in a range satisfying
$\psi=90°+180°\times n\pm60°$.

Due to the material and crystal orientation of the carrier substrate being set in this way, unnecessary vibrations are effectively reduced, and the spurious emission in the high frequency band is effectively reduced.

(6) Furthermore, in the Euler angles described in the above (5), $\psi$ is set in a range satisfying $$\psi=90°+180°\times n\pm25°.$$

Thereby, even if there is an error in the crystal orientation of the carrier substrate with respect to the propagation direction of the surface acoustic wave of the piezoelectric layer, at the time when the piezoelectric layer and the carrier substrate are bonded to each other, the spurious emission in the high frequency band can be reduced. Specifically, due to the angle range of $\psi$ being set to a range excluding a range of an angle error at the time of bonding, the spurious emission in the high frequency band can be surely reduced.

It is preferable in one aspect of the elastic wave device having the intermediate layer described above that the intermediate layer is of silicon dioxide. Due to the material of the intermediate layer being set to be the silicon dioxide in this way, the bonding between both of the above two materials can be facilitated.

In one aspect of the above-described elastic wave device, a silicon polycrystalline layer may exist on the bonding face of the carrier substrate. The existence of the silicon polycrystalline layer provides an effect of reducing a leakage current of high frequency, and provides an effect of suppressing a high-frequency noise when the piezoelectric layer is thinned to be close to a wavelength of a high frequency.

In one aspect of the elastic wave device having the above-described intermediate layer, the intermediate layer may be formed from aluminum nitride or aluminum boron nitride. Due to such an intermediate layer being provided, the propagation speed of the surface elastic wave to be propagated can be enhanced, and the characteristics at higher frequency can be improved.

It is preferable in one aspect of the elastic wave device described above that the piezoelectric layer is formed from lithium tantalate or lithium niobate. Due to such a material being set for the piezoelectric layer, a high electromechanical coupling coefficient and a high Q value can be obtained.

In one aspect of the filter, an elastic wave filter is realized by a structure in which the elastic wave devices are assembled into a ladder structure, and thereby, a filter can be provided in which the spurious emission in the high frequency band is reduced.

In one aspect of the filter, an elastic wave filter is realized by a structure in which the elastic wave devices are assembled into a DMS structure, and also in this case, a filter can be provided in which the spurious emission in the high frequency band is reduced.

In one aspect of a module, also in the case where a module is realized which is structured while including the elastic wave filter, a module can be provided in which the spurious emission in the high frequency band is reduced.

In one aspect of a duplexer, also in the case where a duplexer is realized which is structured while including the elastic wave filter, a duplexer can be provided in which the spurious emission in the high frequency band is reduced.

In one aspect of a module, also in the case where a module is realized which is structured while including the duplexer, a module can be provided in which the spurious emission in the high frequency band is reduced.

DESCRIPTION OF SYMBOLS 1, 1A, 1B, 1S, 1P . . . elastic wave device
  2 . . . carrier substrate
  3 . . . piezoelectric layer
  4 . . . electrode
  4A . . . IDT
  4B, 4C . . . reflectors
  5 . . . intermediate layer
  5a . . . first intermediate layer
  5b . . . second intermediate layer
  6A, 6B . . . spurious
  10, 17 . . . elastic wave filter
  27 . . . duplexer
  33, 41 . . . module

The invention claimed is:

1. An elastic wave device that excites main vibration of an SH mode, comprising: a piezoelectric layer formed from a piezoelectric material; a carrier substrate; and an IDT electrode formed on the piezoelectric layer, wherein
- when a wavelength of an elastic wave, which is determined by an electrode cycle of the IDT electrode, is represented by $\lambda$, the piezoelectric layer has a thickness of $0.15\lambda$ or more and $1.5\lambda$ or less;
- the carrier substrate has an acoustic anisotropy, and is arranged in a crystal orientation that reduces unnecessary vibrations of an SV mode and a vertical L-mode; and
- a polycrystalline silicon layer on a bonding face of the carrier substrate, wherein
- one or more intermediate layers are provided between the carrier substrate and the piezoelectric layer, the one or more intermediate layers playing at least one of roles of facilitating the bonding between the carrier substrate and the piezoelectric layer, and speeding up acoustic velocity of the elastic wave.

2. The elastic wave device according to claim 1, wherein the thickness of the piezoelectric layer is $0.15\lambda$ or more and $0.55\lambda$ or less.

3. The elastic wave device according to claim 1, wherein
- the carrier substrate is formed of silicon having a non-amorphous crystal form; and a crystal orientation thereof is $(\phi, 45°, 45°)$ in notation of Euler angles $(\phi, \theta, \psi)$ of a (z, x, z) form, with respect to a propagation direction of the elastic wave in the piezoelectric layer, and φ is in a range satisfying:

φ=10°+90°×n±25° (n: integer).

4. The elastic wave device according to claim 1, wherein the carrier substrate is formed of silicon having a non-amorphous crystal form; and a crystal orientation thereof is (0°, θ, 45°) in notation of Euler angles (φ, θ, ψ) of a (z, x, z) form, with respect to a propagation direction of the elastic wave in the piezoelectric layer, and θ is in a range satisfying:

θ=45°+90°×n±25°(n: integer).

5. The elastic wave device according to claim 1, wherein the carrier substrate is formed of silicon having a non-amorphous crystal form; and a crystal orientation thereof is (φ, 90°, 45°) in notation of Euler angles (φ, θ, ψ) of a (z, x, z) form, with respect to a propagation direction of the elastic wave in the piezoelectric layer, and φ is in a range satisfying:

φ=42.5°+90°×n±22.5° (n: integer).

6. The elastic wave device according to claim 1, wherein the carrier substrate is formed of silicon having a non-amorphous crystal form; and a crystal orientation thereof is (135°, θ, 45°) in notation of Euler angles (φ, θ, ψ) of a (z, x, z) form, with respect to a propagation direction of the elastic wave in the piezoelectric layer, and θ is in a range satisfying:

θ=30°+180°×n±15° (n: integer), or

θ=122°+180°×n±43° (n: integer).

7. The elastic wave device according to claim 1, wherein the carrier substrate is formed of silicon having a non-amorphous crystal form; and a crystal orientation thereof is (90°, 45°, ψ), (−90°, −45°, ψ), (90°, −45°, ψ), (−90°, 45°, ψ), (0°, −45°, ψ), (180°, 45°, ψ), (0°, 45°, ψ), or (180°, −45°, ψ) in notation of Euler angles (φ, θ, ψ) of a (z, x, z) form, with respect to a propagation direction of the elastic wave in the piezoelectric layer, and ψ is in a range satisfying:

ψ=90+180°×n±60°(n: integer).

8. The elastic wave device according to claim 1, wherein the carrier substrate is formed of silicon having a non-amorphous crystal form; and a crystal orientation thereof is (90°, 45°, ψ), (−90°, −45°, ψ), (90°, −45°, ψ), (−90°, 45°, ψ), (0°, −45°, ψ), (180°, 45°, ψ), (0°, 45°, ψ), or (180°, −45°, ψ) in notation of Euler angles (φ, θ, ψ) of a (z, x, z) form, with respect to a propagation direction of the elastic wave in the piezoelectric layer, and ψ is in a range satisfying:

ψ=90°+180°×n±25° (n: integer).

9. The elastic wave device according to claim 1, wherein the piezoelectric layer is formed from lithium tantalate or lithium niobate.

10. The elastic wave device according to claim 1, further comprising at least one additional elastic wave device, wherein the at least one additional elastic wave device has same configuration as that of the elastic wave device, wherein the elastic wave device and the at least one additional elastic wave device are assembled into a ladder structure to form an elastic wave filter.

11. The elastic wave device according to claim 1, further comprising at least one additional elastic wave device, wherein the at least one additional elastic wave device has same configuration as that of the elastic wave device, wherein the elastic wave device and the at least one additional elastic wave device are assembled into a DMS structure to form an elastic wave filter.

12. The elastic wave device according to claim 10, wherein the elastic wave filter is a part of a module.

13. The elastic wave device according to claim 11, wherein the elastic wave filter is a part of a module.

14. The elastic wave device according to claim 10, wherein the elastic wave filter is a part of a duplexer.

15. The elastic wave device according to claim 11, wherein the elastic wave filter is a part of a duplexer.

16. The elastic wave device according to claim 14, wherein the duplexer is a part of a module.

17. The elastic wave device according to claim 15, wherein the duplexer is a part of a module.

18. An elastic wave device that excites main vibration of an SH mode, comprising: a piezoelectric layer formed from a piezoelectric material; a carrier substrate; and an IDT electrode formed on the piezoelectric layer, wherein
when a wavelength of an elastic wave, which is determined by an electrode cycle of the IDT electrode, is represented by λ, the piezoelectric layer has a thickness of 0.15λ or more and 1.5λ or less; and
the carrier substrate has an acoustic anisotropy, and is arranged in a crystal orientation that reduces unnecessary vibrations of an SV mode and a vertical L-mode,
wherein one or more intermediate layers are provided between the carrier substrate and the piezoelectric layer, the one or more intermediate layers playing at least one of roles of facilitating the bonding between the carrier substrate and the piezoelectric layer, and speeding up acoustic velocity of the elastic wave, wherein
the intermediate layer is formed from aluminum nitride or aluminum boron nitride.

* * * * *